(12) United States Patent
Lee et al.

(10) Patent No.: US 9,947,714 B2
(45) Date of Patent: Apr. 17, 2018

(54) METHODS OF MANUFACTURING IMAGE SENSORS

(71) Applicant: SAMSUNG ELECTRONICS CO., LTD., Suwon-si, Gyeonggi-do (KR)

(72) Inventors: Jeong-Ho Lee, Seoul (KR); Hyun-Pil Noh, Seongnam-Si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/633,195

(22) Filed: Jun. 26, 2017

(65) Prior Publication Data

US 2018/0019280 A1  Jan. 18, 2018

(30) Foreign Application Priority Data

Jul. 13, 2016 (KR) .................. 10-2016-0088587

(51) Int. Cl.
*H01L 21/00* (2006.01)
*H01L 27/146* (2006.01)

(52) U.S. Cl.
CPC .. *H01L 27/14685* (2013.01); *H01L 27/14687* (2013.01); *H01L 27/14689* (2013.01)

(58) Field of Classification Search
CPC ......... H01L 27/14685; H01L 27/14689; H01L 27/14687
See application file for complete search history.

(56) References Cited

U.S. PATENT DOCUMENTS 6,809,008 B1 * 10/2004 Holm ................ H01L 27/14634
                                                    438/455
7,989,861 B2    8/2011 Kim et al.
(Continued)

FOREIGN PATENT DOCUMENTS

JP       02-134993      5/1990
JP       06-342896     12/1994
(Continued)

*Primary Examiner* — Richard Booth
(74) *Attorney, Agent, or Firm* — F. Chau & Associates, LLC

(57) ABSTRACT

In a method of manufacturing an image sensor, photodiodes may be formed on a semiconductor layer in an active pixel region and a peripheral region. A structure including insulating interlayers and wiring structures may be formed on a first surface of the semiconductor layer in the active pixel region, the peripheral region and an input/output (I/O) region. The semiconductor layer and a first insulating interlayer of the insulating interlayers on the I/O region may be partially etched to form a via hole exposing a first wiring structure of the wiring structures. A first metal layer and a second metal layer may be formed on a second surface of the semiconductor layer and the via hole. The second metal layer may be patterned to form a second pad pattern on the semiconductor layer in the I/O region. An anti-reflective layer may be formed on the first metal layer and the second pad pattern. The anti-reflective layer and the first metal layer may be patterned to form a light blocking structure including the first metal layer and the anti-reflective layer in the peripheral region, and a pad structure including a via contact, a first pad pattern, the second pad pattern and an anti-reflective pattern in the I/O region. An image failure due to the reflected light may be minimized.

20 Claims, 26 Drawing Sheets

(56) References Cited

U.S. PATENT DOCUMENTS

| | | | |
|---|---|---|---|
| 9,124,791 B2 | 9/2015 | Kim et al. | |
| 9,219,092 B2 | 12/2015 | Jangjian et al. | |
| 2004/0219708 A1* | 11/2004 | Lee | H01L 27/14685 438/57 |
| 2015/0185366 A1 | 7/2015 | Bone et al. | |

FOREIGN PATENT DOCUMENTS

| | | |
|---|---|---|
| JP | 2005-005540 | 1/2005 |
| JP | 2008-028101 | 2/2008 |

\* cited by examiner

METHODS OF MANUFACTURING IMAGE SENSORS

CROSS-REFERENCE TO RELATED APPLICATION

This application claims priority under 35 U.S.C. §119 to Korean Patent Application No. 10-2016-0088587, filed on Jul. 13, 2016 in the Korean Intellectual Property Office (KIPO), the contents of which are herein incorporated by reference in their entirety.

TECHNICAL FIELD

Example embodiments relate to a method of manufacturing an image sensor, and more particularly, relate to a method of manufacturing a backside illumination image sensor.

DISCUSSION OF RELATED ART

In an image sensor, each pixel needs to have high light receiving efficiency and high optical sensitivity. Thus, a backside illumination image sensor in which light may be incident onto the backside of a substrate and photoelectric conversion may occur has been developed. With backside illumination, the image sensor does not let light pass through transistors, dielectric layers and metal circuitry from the front side, and will allow more light to hit each pixel from the backside, so that the resulting images may have less digital noise and better low-light performance.

SUMMARY

Example embodiments of the present inventive concept provide a method of manufacturing an image sensor having enhanced characteristics.

According to an example embodiment of the present inventive concept, there is provided a method of manufacturing an image sensor. In the method, a plurality of photodiodes may be formed in a semiconductor layer in an active pixel region and a peripheral region. A structure including a plurality of insulating interlayers and a plurality of wiring structures may be formed on a first surface of the semiconductor layer in the active pixel region, the peripheral region and an input/output (I/O) region. The semiconductor layer and a first insulating interlayer of the plurality of insulating interlayers on the I/O region may be partially etched to form a via hole therethrough. The via hole may expose a first wiring structure of the plurality of wiring structures. A first metal layer and a second metal layer may be sequentially formed on a second surface of the semiconductor layer and the via hole. The second surface may be opposite to the first surface. The second metal layer may be patterned to form a second pad pattern on the semiconductor layer in the I/O region, so that the first metal layer may be exposed in the active pixel region and the peripheral region. An anti-reflective layer may be formed on the first metal layer and the second pad pattern. The anti-reflective layer and the first metal layer may be patterned to form a light blocking structure including the first metal layer and the anti-reflective layer in the peripheral region, and a pad structure including a via contact, a first pad pattern, the second pad pattern and a first anti-reflective pattern in the I/O region.

According to an example embodiment of the present inventive concept, there is provided a method of manufacturing an image sensor. In the method, a plurality of photodiodes may be formed in a semiconductor layer in an active pixel region and a peripheral region. A structure including a plurality of insulating interlayers and a plurality of wiring structures may be formed on a first surface of the semiconductor layer in the active pixel region, the peripheral region and an input/output (I/O) region. The semiconductor layer may be partially etched to form an isolation trench therethrough. The isolation trench may expose a first insulating interlayer of the plurality of insulating interlayers. An insulation layer may be formed on a second surface of the semiconductor layer and an inner wall of the isolation trench. The second surface may be opposite to the first surface. The semiconductor layer and the first insulating interlayer in the I/O region may be partially etched to form a via hole therethrough, the via hole exposing a first wiring structure of the plurality of wiring structures. A first metal layer and a second metal layer may be sequentially formed on the insulation layer and the via hole. The second metal layer may be patterned to form a second pad pattern on the semiconductor layer in the I/O region, so that the first metal layer may be exposed in the active pixel region and the peripheral region. An anti-reflective layer may be formed on the first metal layer and the second pad pattern. The anti-reflective layer and the first metal layer may be patterned to form a light blocking structure including the first metal layer and the anti-reflective layer in the peripheral region, and a pad structure including a via contact, a first pad pattern, the second pad pattern and a first anti-reflective pattern in the I/O region.

According to an example embodiment of the present inventive concept, there is provided a method of manufacturing an image sensor. In the method, a plurality of photodiodes may be formed in a semiconductor layer in an active pixel region and a peripheral region. An insulating interlayer and a wiring structure may be sequentially formed on a first surface of the semiconductor layer in the active pixel region, the peripheral region and an input/output (I/O) region. A via hole through the semiconductor layer and the insulating interlayer may be formed to expose the wiring structure. A first metal layer and a second metal layer may be sequentially formed on a second surface of the semiconductor layer and the via hole. The second surface may be opposite to the first surface. The second metal layer may be patterned to form a second pad pattern in the I/O region, so that the first metal layer may be exposed in the active pixel region and the peripheral region. An anti-reflective layer may be formed on the first metal layer and the second pad pattern. The anti-reflective layer and the first metal layer may be patterned to form a light blocking structure including the first metal layer and the anti-reflective layer in the peripheral region, a pad structure including a via contact, a first pad pattern, the second pad pattern and a first anti-reflective pattern in the I/O region, and a grid structure including a first metal pattern and a second anti-reflective pattern stacked between unit pixels in the active pixel region.

According to an example embodiment of the present inventive concept, the light blocking layer and the anti-reflective layer may be formed on the second surface of the substrate in the peripheral region. Incident light onto the peripheral region may be blocked by the light blocking layer, and may not be reflected by the anti-reflective layer. Thus, a diffused reflection of the incident light may be reduced, and thus an incidence of the reflected light onto the active pixel region may also be reduced. Thus, an image failure due to the reflected light may be minimized in the image sensor.

BRIEF DESCRIPTION OF THE DRAWINGS

Example embodiments of the present inventive concept will be more clearly understood from the following detailed description taken in conjunction with the accompanying drawings in which.

Figure 1:
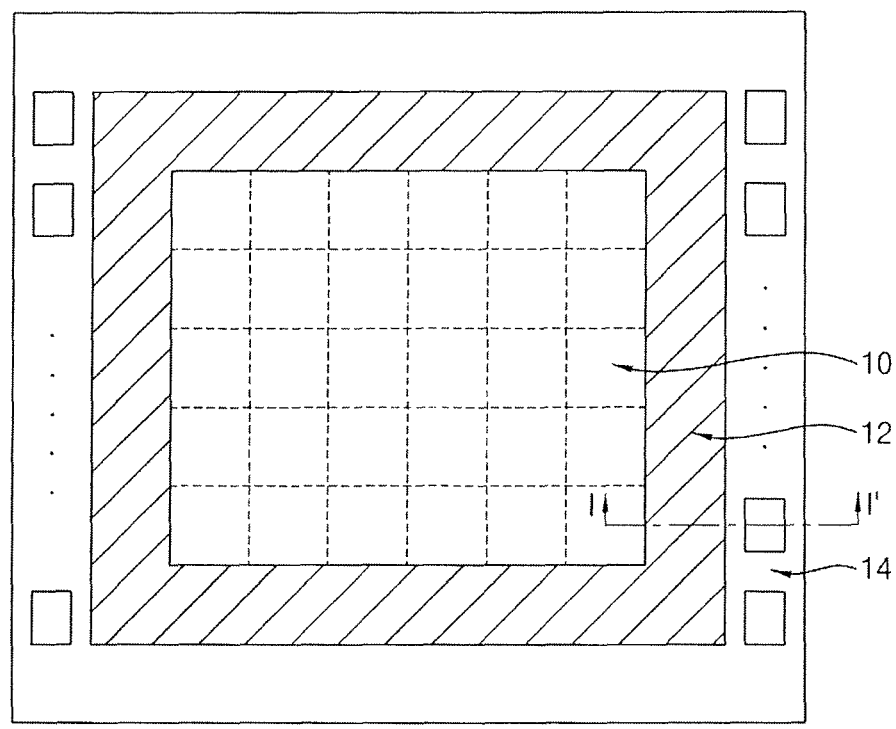
FIG. 1 is a plan view illustrating regions of a backside illumination image sensor in accordance with an example embodiment of the present inventive concept.

Since the drawings in FIGS. 1-26 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 is a plan view illustrating the layout of regions of a backside illumination image sensor in accordance with an example embodiment of the present inventive concept.

Referring to FIG. 1, the backside illumination image sensor may include an active pixel region 10, a peripheral region 12 and an input/output (I/O) region 14.

The active pixel region 10 may include a plurality of unit pixels arranged in a grid pattern. The peripheral region 12 may surround the active pixel region 10. In an example embodiment of the present inventive concept, the peripheral region 12 may be disposed between the active pixel region 10 and the I/O region 14. The peripheral region 12 may include control circuits. In an example embodiment of the present inventive concept, the peripheral region 12 may include, e.g., an optical black region, a guard ring region, etc. The optical black region may include a photodiode and a metal-oxide semiconductor (MOS) transistor, and the guard ring region may not include a photodiode. The optical black region may contain black pixels which are the reference pixels within an imaging sensor. The I/O region 14 may include a plurality of pad structures through which signals may be transferred to the active pixel region 10 and the peripheral region 12. In an example embodiment of the present inventive concept, the I/O region 14 may include a via contact, an isolation trench and a pad electrode. The isolation trench may be spaced apart from the via contact, and may surround the via contact. The pad electrode may contact the via contact. The pad electrode and the via contact may be electrically connected to metal circuitry of the image sensor.

FIGS. 2 to 19 are cross-sectional views and plan views illustrating stages of a method of manufacturing a backside illumination image sensor in accordance with an example embodiment of the present inventive concept;

FIGS. 2, 3, 4, 6, 7, 9, 10, 11, 12, 14, 16, 18 and 19 are cross-sectional views taken along line I-I' indicated in FIG. 1. FIGS. 5, 8, 13, 15 and 17 are plan views illustrating portions of the active pixel region, the peripheral region and the I/O region of the backside illumination image sensor.

Figure 2:
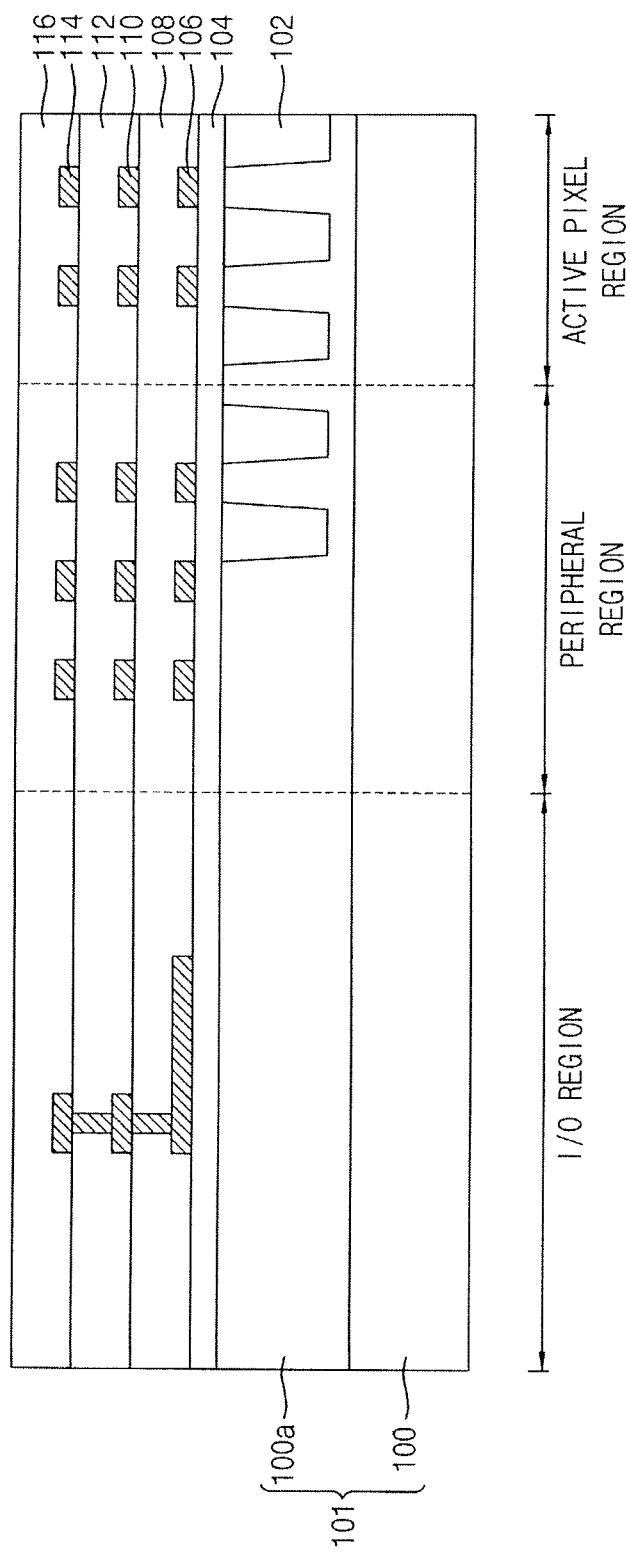
FIGS. 2 to 19 are cross-sectional views and plan views illustrating stages of a method of manufacturing a backside illumination image sensor in accordance with an example embodiment of the present inventive concept.

Referring to FIG. 2, a plurality of photodiodes 102 may be formed at upper portions of a substrate 101, and wiring structures 106, 110 and 114 and insulating interlayers 104, 108, 112 and 116 may be formed on the substrate 101.

In an example embodiment of the present inventive concept, the substrate 101 may include a semiconductor substrate 100 and a semiconductor layer 100a sequentially stacked. The semiconductor layer 100a may be formed by an epitaxial growth process using a surface of the semiconductor substrate 100 as a seed. In an example embodiment of the present inventive concept, the semiconductor substrate 100 may be doped with p-type impurities. The semiconductor layer 100a may be doped with p-type impurities to have an impurity concentration lower than an impurity concentration of the semiconductor substrate 100. In an example embodiment of the present inventive concept, the semiconductor layer 100a may have a thickness of about 1 µm to about 100 µm. In an example embodiment of the present inventive concept, the substrate 101 may include only the semiconductor substrate 100. The semiconductor substrate 101 may include silicon. Alternatively, or additionally, the substrate 101 may include another semiconductor element, such as germanium.

The substrate 101 may include the active pixel region, the peripheral region and the I/O region.

An isolation pattern may be formed on the semiconductor layer 100a. Thus, a portion of the semiconductor layer 100a on which the isolation pattern is formed may be defined as a field region, and a portion of the semiconductor layer 100a on which no isolation pattern is formed may be defined as an active region. The isolation pattern may be formed by a shallow trench isolation process. Particularly, the semiconductor layer 100a may be partially etched to form a trench, and an isolation material, e.g., silicon oxide may fill the trench to form the isolation pattern.

An insulation layer and a gate electrode layer may be formed on the semiconductor layer 100a, and the insulation layer and the gate electrode layer may be patterned to form a gate structure including a gate insulation pattern and a gate electrode. Impurity regions may be formed at upper portions of the semiconductor layer 100a adjacent to the gate structure. The impurity regions may be formed at each side of the gate structure as a source region and a drain region, with a channel region interposed therebetween. The gate structure and the impurity regions formed at the upper portions of the semiconductor layer 100a may form a transistor. In an example embodiment of the present inventive concept, a plurality of transistors serving as a transfer transistor, a reset transistor, a switch transistor and a select transistor may be formed in each of the unit pixels. The transistors may constitute the control circuits on the peripheral region of the substrate 101.

Impurities may be doped into the semiconductor layer 100a to form the photodiodes 102. In an example embodiment of the present inventive concept, the photodiodes 102 may be formed in the semiconductor layer 100a in the active pixel region and a portion of the peripheral region, e.g., the optical black region. In an example embodiment of the present inventive concept, the isolation pattern may be formed between the photodiodes 102 in the unit pixels.

A first insulating interlayer 104 may be formed on the semiconductor layer 100a. The first insulating interlayer 104 may cover an upper surface of the semiconductor layer 100a. The wiring structures 106, 110 and 114 and the insulating interlayers 108, 112 and 116 may be formed on the first insulating interlayer 104. In an example embodiment of the present inventive concept, as shown in FIG. 2, the wiring structures may include a first wiring structure 106, a second wiring structure 110 and a third wiring structure 114, and the insulating interlayers may include a second insulating interlayer 108, a third insulating interlayer 112 and a fourth insulating interlayer 116.

Each of the wiring structures may include a contact plug and a contact pattern. A plurality of contact plugs and a plurality of contact patterns may be formed in the insulating interlayers. The wiring structures may include a metal, e.g., copper (Cu), platinum (Pt), tungsten (W), aluminum (Al), or an alloy thereof. In an example embodiment of the present inventive concept, the wiring structures may further include a barrier layer for preventing the diffusion of the metal.

The number of the contact plugs and the conductive patterns may not be limited, and may be variously modified according to the device design. Light penetration may be more influenced by the wiring structures 106, 110 and 114 in the front side illumination system than that in the backside illumination system, and thus the wiring structures 106, 110 and 114 may be disposed regardless of positions of the photodiodes 102. An upper surface of an uppermost insulating interlayer, e.g., the fourth insulating interlayer 116 may be flat.

Figure 3:
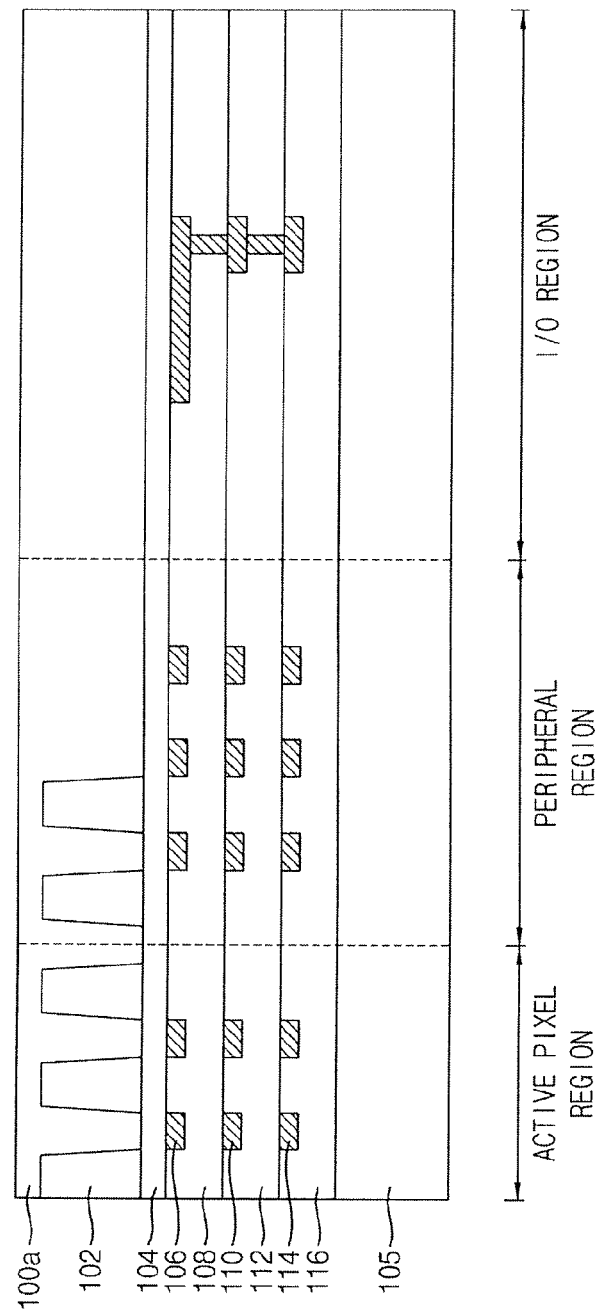

Referring to FIG. 3, a support substrate 105 may be bonded onto the uppermost insulating interlayer 116.

Hereinafter, the support substrate 105 is shown to be disposed below the semiconductor layer 100a in the figures. The support substrate 105 may support the semiconductor layer 100a, the wiring structures 106, 110 and 114, and the insulating interlayers 104, 108, 112 and 116, during subsequent processes. Various materials may be used for the support substrate 105. For example, the support substrate 105 may be a glass substrate or a silicon substrate.

Most of the semiconductor substrate 100 may be removed by a mechanical grinding process.

In an example embodiment of the present inventive concept, after the mechanical grinding process, the semiconductor layer 100a may be exposed, and the photodiodes 102 may be adjacent to a surface of the semiconductor layer 100a. In an example embodiment of the present inventive concept, after the grinding process, a portion of the semiconductor substrate 100 may remain. Alternatively, during the grinding process, the semiconductor layer 100a may be also partially removed.

Hereinafter, a surface of the semiconductor layer 100a on which light may be incident may be referred to as a second surface, and a surface of the semiconductor layer 100a opposite to the second surface may be referred to as a first surface. The second surface of the semiconductor layer 100a may be exposed after the grinding process, and the wiring structures 106, 110 and 114, and the insulating interlayers 104, 108, 112 and 116 may be formed on the first surface of the semiconductor layer 100a.

Figure 4:
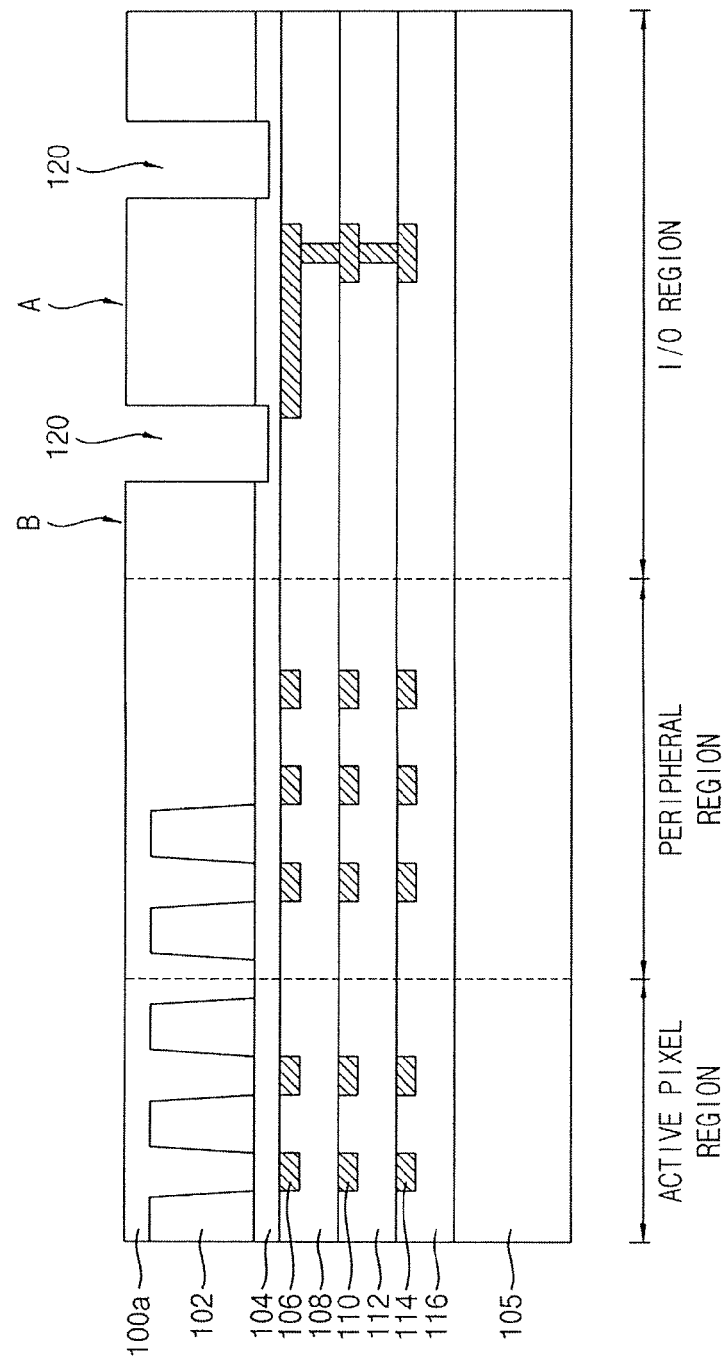
Figure 5:
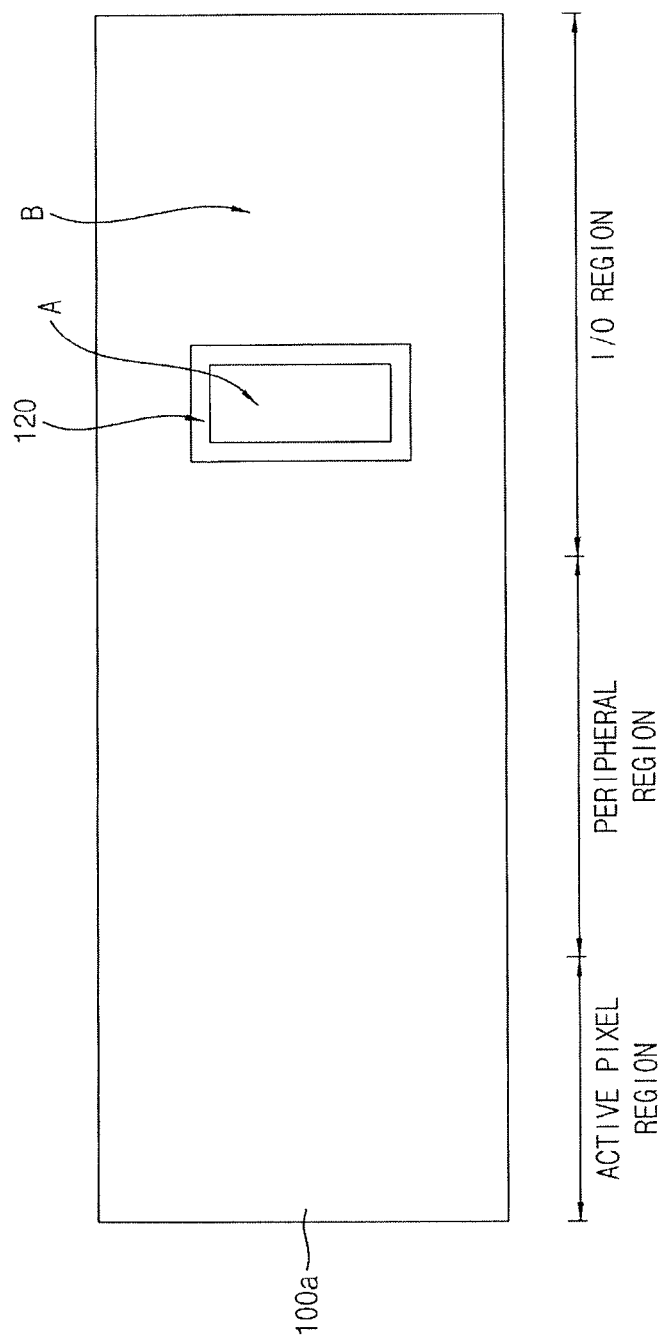

Referring to FIGS. 4 and 5, the semiconductor layer 100a in the I/O region may be etched to form an isolation trench 120 through the semiconductor layer 100a. The etching process may include an anisotropic etching process.

A first mask for forming the isolation trench 120 may be formed on the second surface of the semiconductor layer 100a. The first mask may be a patterned photoresist formed by a photolithography process. The semiconductor layer 100a may be etched using the first mask as an etching mask to form the isolation trench 120 through the semiconductor layer 100a such that the isolation trench 120 may expose a surface of the first insulating interlayer 104.

A via contact may be sequentially formed, and the semiconductor layer 100a may be electrically isolated from each other by the isolation trench 120. That is, referring to FIG. 5, the isolation trench 120 may have a ring shape (e.g., a rectangular ring shape) surrounding a via contact region, in a plan view. Thus, the semiconductor layer 100a may be divided by the isolation trench 120 into a first portion A and a second portion B. The first portion A may be an inner portion of the semiconductor layer 100a surrounded by the isolation trench 120, and the second portion B may be an outer portion of the semiconductor layer 100a at an outside of the isolation trench 120. The first portion A may be spaced apart from the second portion B, and may have an island shape. The via contact may be subsequently formed in the first portion A of the semiconductor layer 100a. Thus, the first portion A of the semiconductor layer 100a may correspond to the via contact region.

The wiring structures 106, 110 and 114 may not be exposed by the isolation trench 120. The first insulation interlayer 104 may be exposed by the isolation trench 120.

In an example embodiment of the present inventive concept, when the isolation trench 120 is formed, an upper portion of the first insulating interlayer 104 may be etched. Thus, a bottom of the isolation trench 120 may be lower than the first surface of the semiconductor layer 100a.

Figure 6:
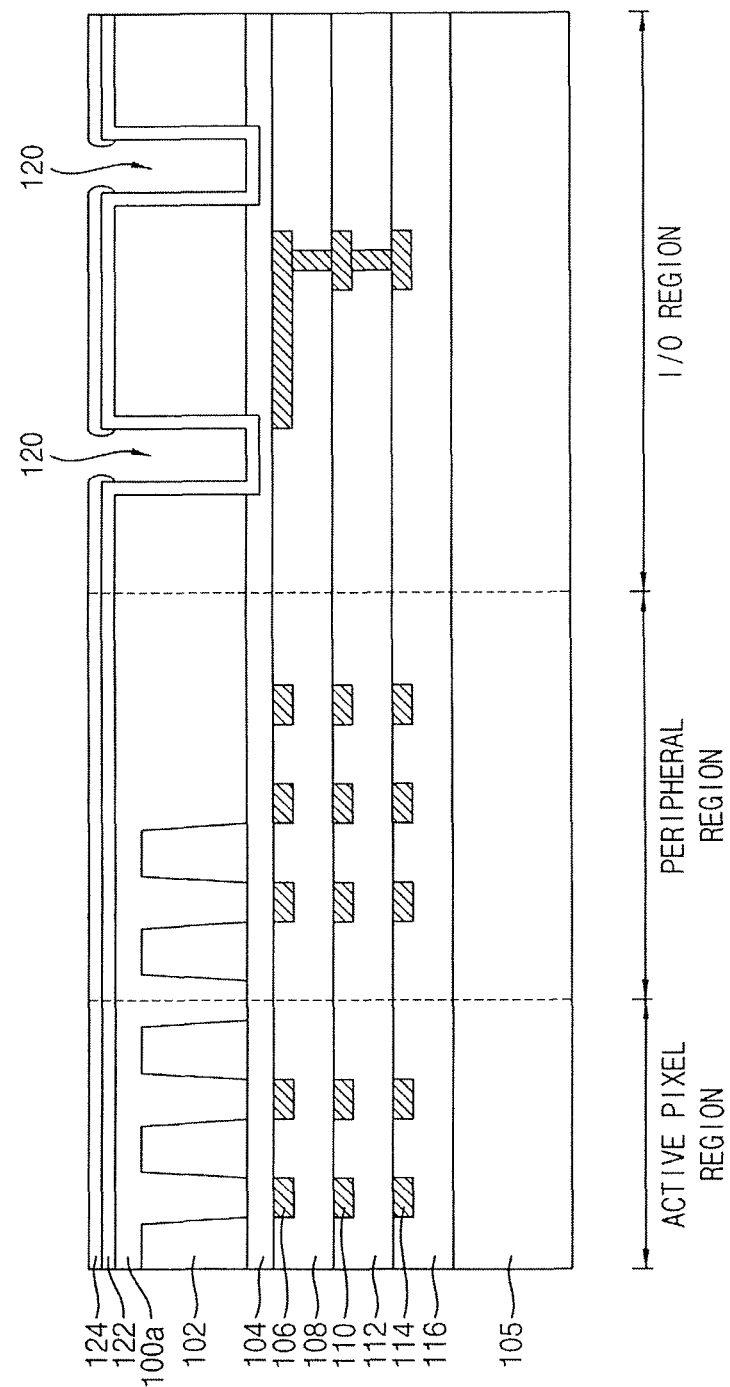

Referring to FIG. 6, a first insulation layer 122 may be conformally formed on an inner wall, which may include a sidewall and a bottom wall, of the isolation trench 120 and the first surface of the semiconductor layer 100. A second insulation layer 124 may be formed on the first insulation layer 122.

In an example embodiment of the present inventive concept, the first insulation layer 122 may be formed of a metal oxide, e.g., hafnium oxide, tantalum oxide, or the like. As the first insulation layer 122 including a metal oxide is formed on the inner wall of the isolation trench 120, hot electrons generated in a pad structure may be removed or cancelled. In an example embodiment of the present inventive concept, the first insulation layer 122 may be formed by, e.g., an atomic layer deposition (ALD) process or a chemical vapor deposition (CVD) process.

The second insulation layer 124 may be formed of, e.g., silicon oxide, silicon nitride, or the like. The second insulation layer 124 may include one layer or at least two layers sequentially stacked.

In an example embodiment of the present inventive concept, the second insulation layer 124 may be formed by a deposition process having poor step coverage. Thus, the second insulation layer 124 may be formed on one portion of the first insulation layer 122, which is on the first surface of the semiconductor layer 100a, and may not be formed on another portion of the first insulation layer 122, which is on the inner wall of the isolation trench 120. In an example embodiment of the present inventive concept, the second insulation layer 124 may be formed by a low pressure chemical vapor deposition (LP-CVD) process.

In an example embodiment of the present inventive concept, the second insulation layer 124 may be conformally formed on the first insulation layer 122. Alternatively, the second insulation layer 124 may not be formed on the first insulation layer 122.

In an example embodiment of the present inventive concept, the first and second insulation layers 122 and 124 may partially fill the isolation trench 120. Alternatively, the first and second insulation layers 122 and 124 may sufficiently fill the isolation trench 120.

Figure 7:
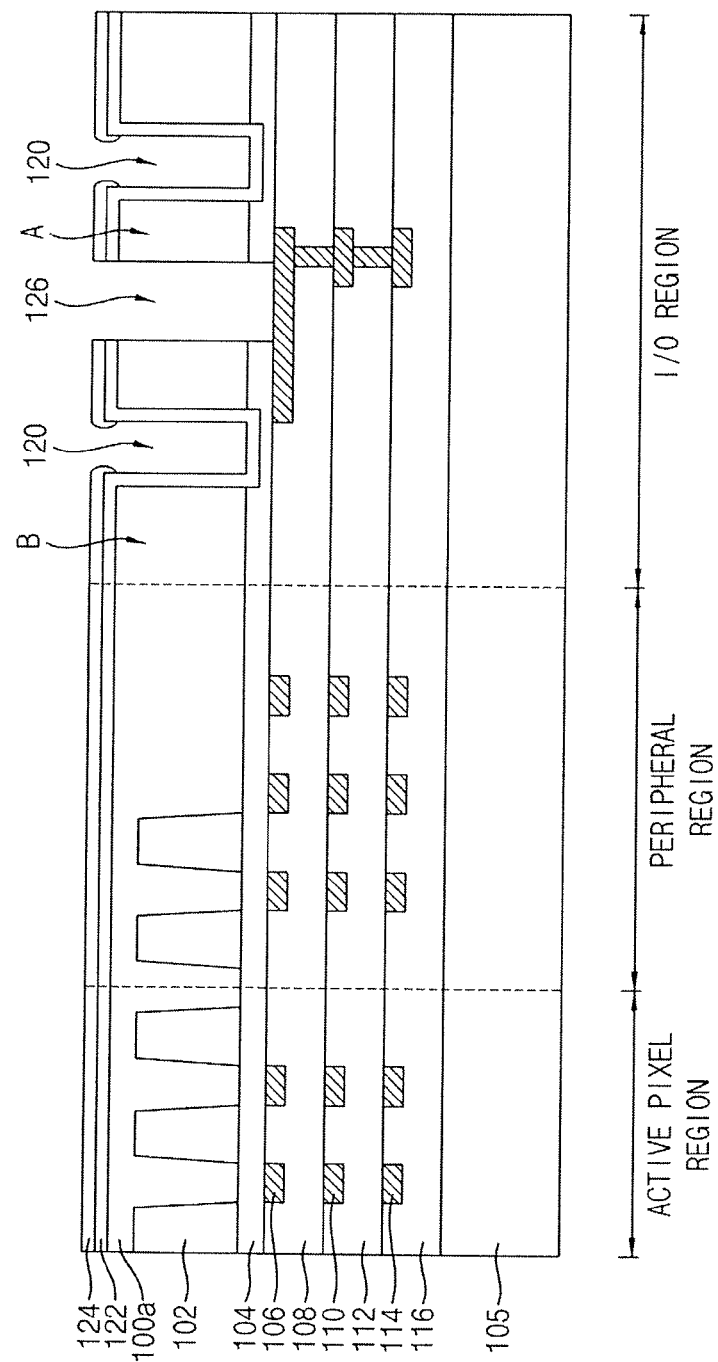
Figure 8:
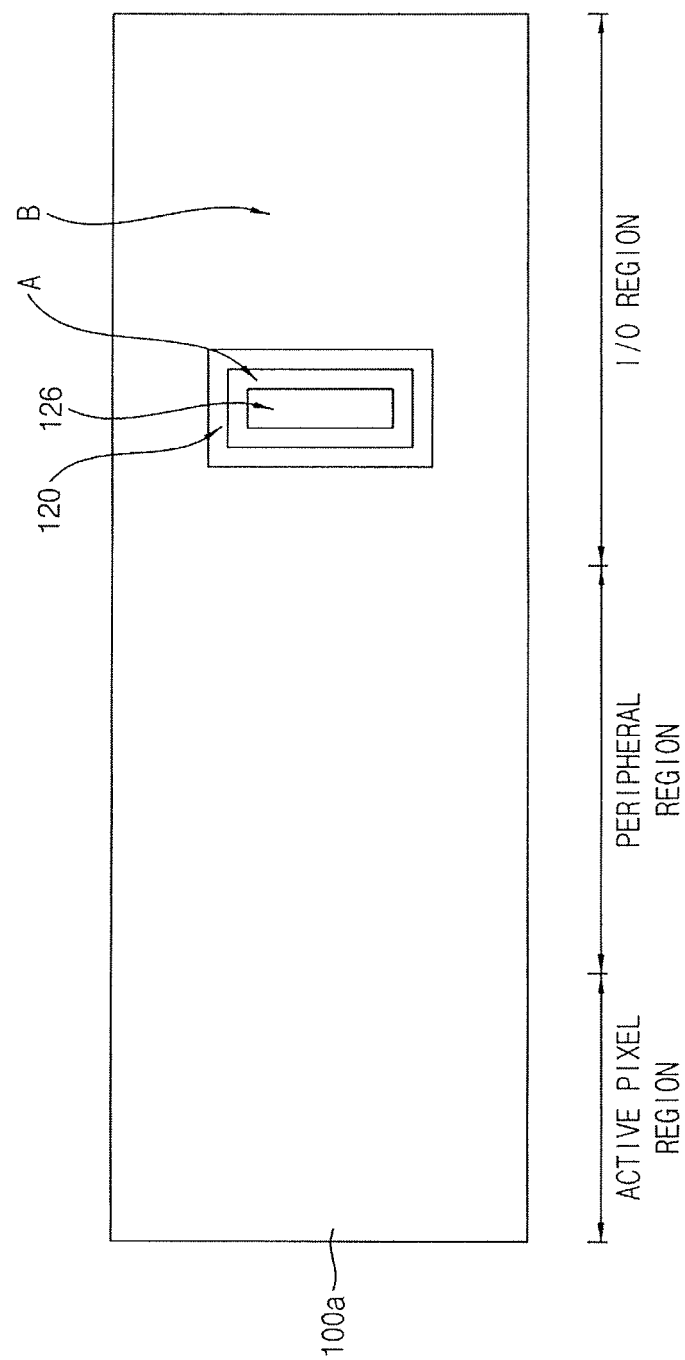

Referring to FIGS. 7 and 8, the first portion A of the semiconductor layer 100a may be partially etched to form a via hole 126 through the semiconductor layer 100a such that the via hole 126 may expose the wiring structure 106.

A second mask for forming the via hole 126 may be formed on the second insulation layer 124. The second mask may be a patterned photoresist formed by a photolithography process. The first and second insulation layers 122 and 124, the semiconductor layer 100a and the first insulating interlayer 104 may be etched using the second mask as an etching mask to form the via hole 126 exposing a portion of the first wiring structure 106. The via hole 126 may be spaced apart from and surrounded by the isolation trench 120.

Figure 9:
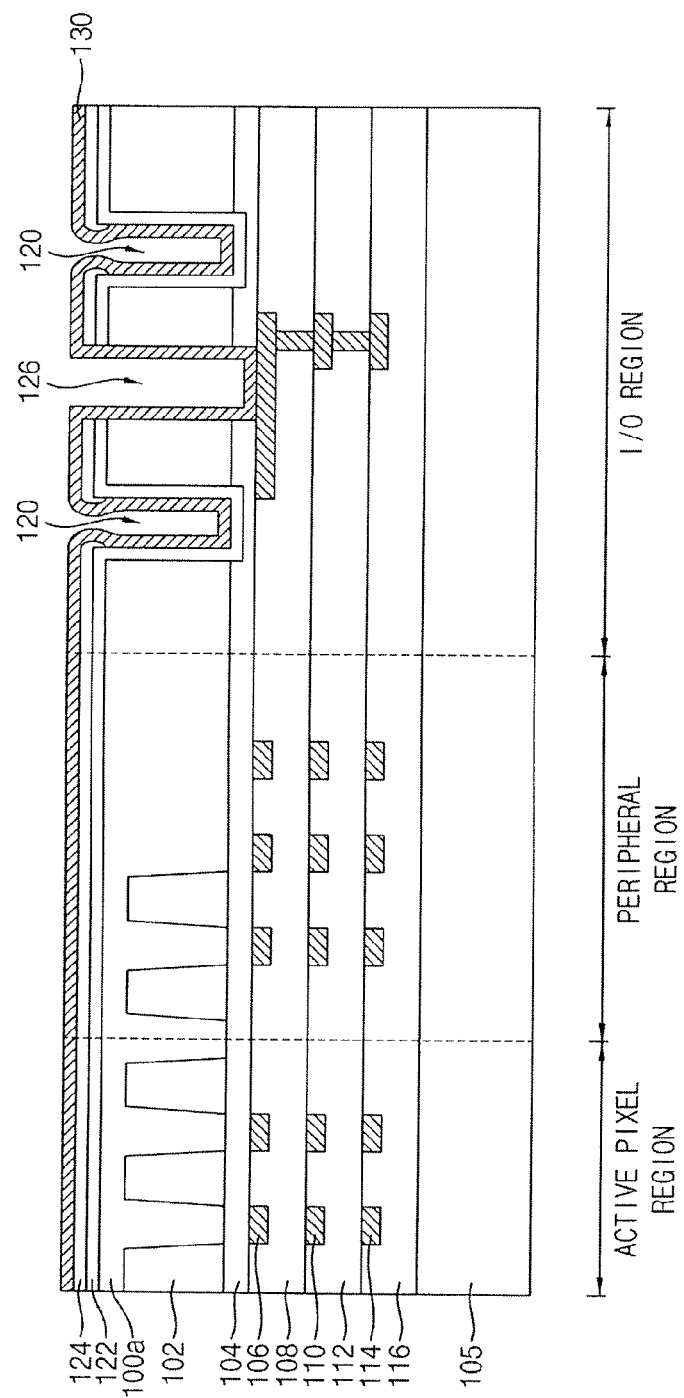

Referring to FIG. 9, a first barrier layer 130 may be conformally formed on the second insulation layer 124, the first insulation layer 122 on the inner wall of the isolation trench 120, a sidewall of the via hole 126, and the exposed portion of the wiring structure 106. The first barrier layer 130 may be formed by, e.g., an ALD process or a CVD process. The first barrier layer 130 may also serve as an ohmic layer.

The first barrier layer 130 may be formed of, e.g., titanium, titanium nitride, tantalum or tantalum nitride. The first barrier layer 130 may include one layer or at least two layers sequentially stacked.

In an example embodiment of the present inventive concept, portions of the first barrier layer 130 on the second insulation layer 124 around an entrance of the isolation trench 120 may contact each other. In this case, an air gap may be formed in the isolation trench 120 by the first barrier layer 130.

Figure 10:
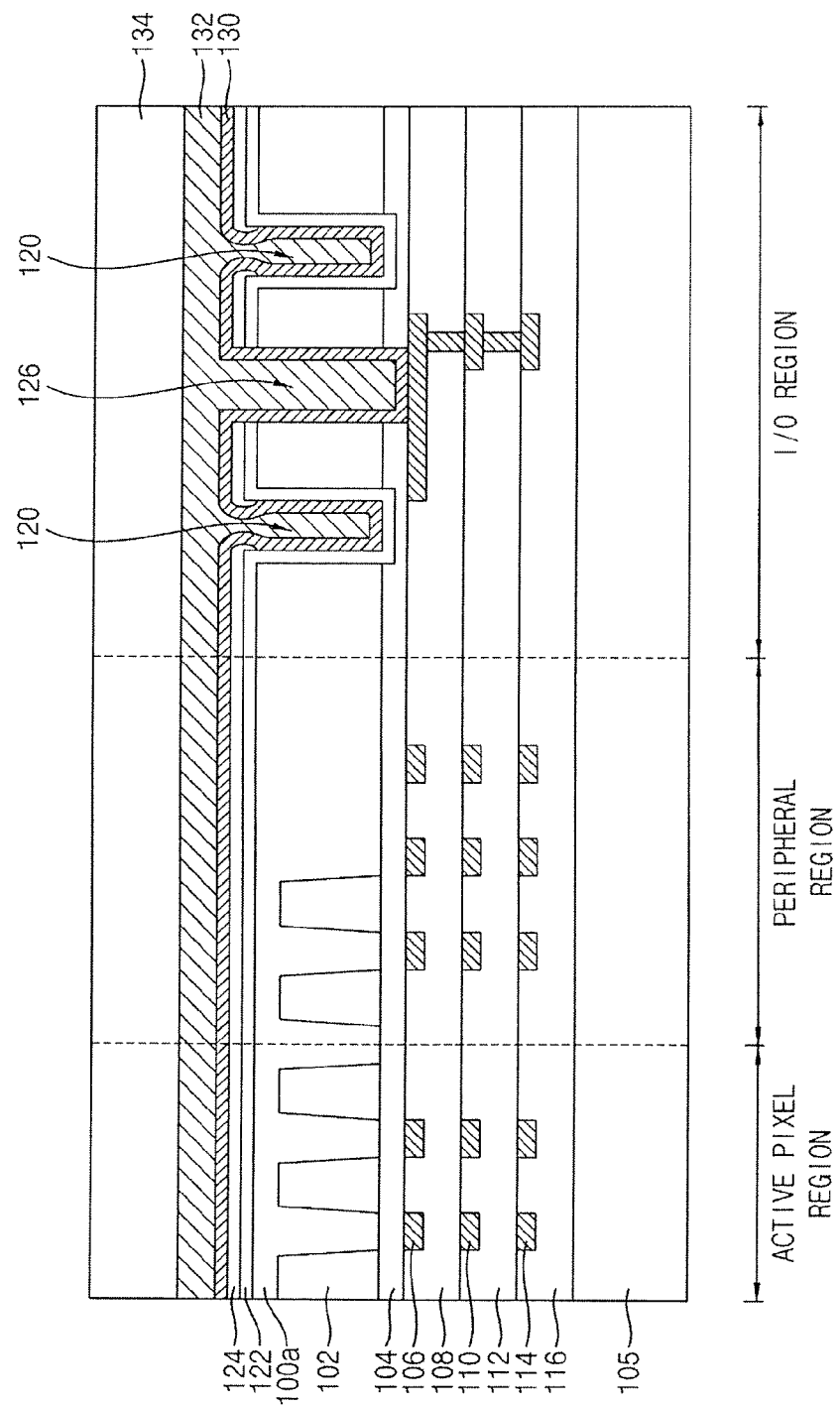

Referring to FIG. 10, a first metal layer 132 may be formed on the barrier layer 130. A second metal layer 134 may be formed on the first metal layer 132.

In an example embodiment of the present inventive concept, the first metal layer 132 may be formed to sufficiently fill the isolation trench 120 and the via hole 126. Alternatively, the first metal layer 132 may be formed to sufficiently fill the isolation trench 120 and partially fill the via hole 126. In this case, the first metal layer 132 may conformally formed on the sidewall of the via hole 126 and the exposed portion of the first wiring structure 106.

In an example embodiment of the present inventive concept, when the first and second insulation layers 122 and 124 sufficiently fill the isolation trench 120, the first metal layer 132 may sufficiently or partially fill the via hole 126. In an example embodiment of the present inventive concept, when the air gap is formed in the isolation trench 120 by the first barrier layer 130, the first metal layer 132 may sufficiently or partially fill the via hole 126.

The first metal layer 132 in the active pixel region may serve as a grid structure for separating unit pixels in a subsequent process. The first metal layer 132 in the peripheral region may serve as a light blocking layer for blocking incident light into the peripheral region. The first metal layer 132 in the I/O region may serve as a via contact for being connected to a pad pattern in a subsequent process.

The first metal layer 132 may be formed of a material having a high reflectivity and a high light blocking rate. For example, the first metal layer 132 may be formed of, e.g., tungsten.

The second metal layer 134 may serve as the pad pattern in a subsequent process. Thus, the second metal layer 134 may be formed of a material having a resistance lower than a resistance of the first metal layer 132. The second metal layer 134 may be formed of a material having an etching selectivity with respect to the first metal layer 132. For example, the second metal layer 134 may be formed of, e.g., aluminum.

In an example embodiment of the present inventive concept, a middle barrier layer may be further formed between the first and second metal layers 132 and 134. The middle barrier layer may be formed of, e.g., titanium (Ti), titanium nitride (TiNx), tantalum (Ta), tantalum nitride (TaNx), or the like. The middle barrier layer may include one layer or at least two layers sequentially stacked.

Figure 11:
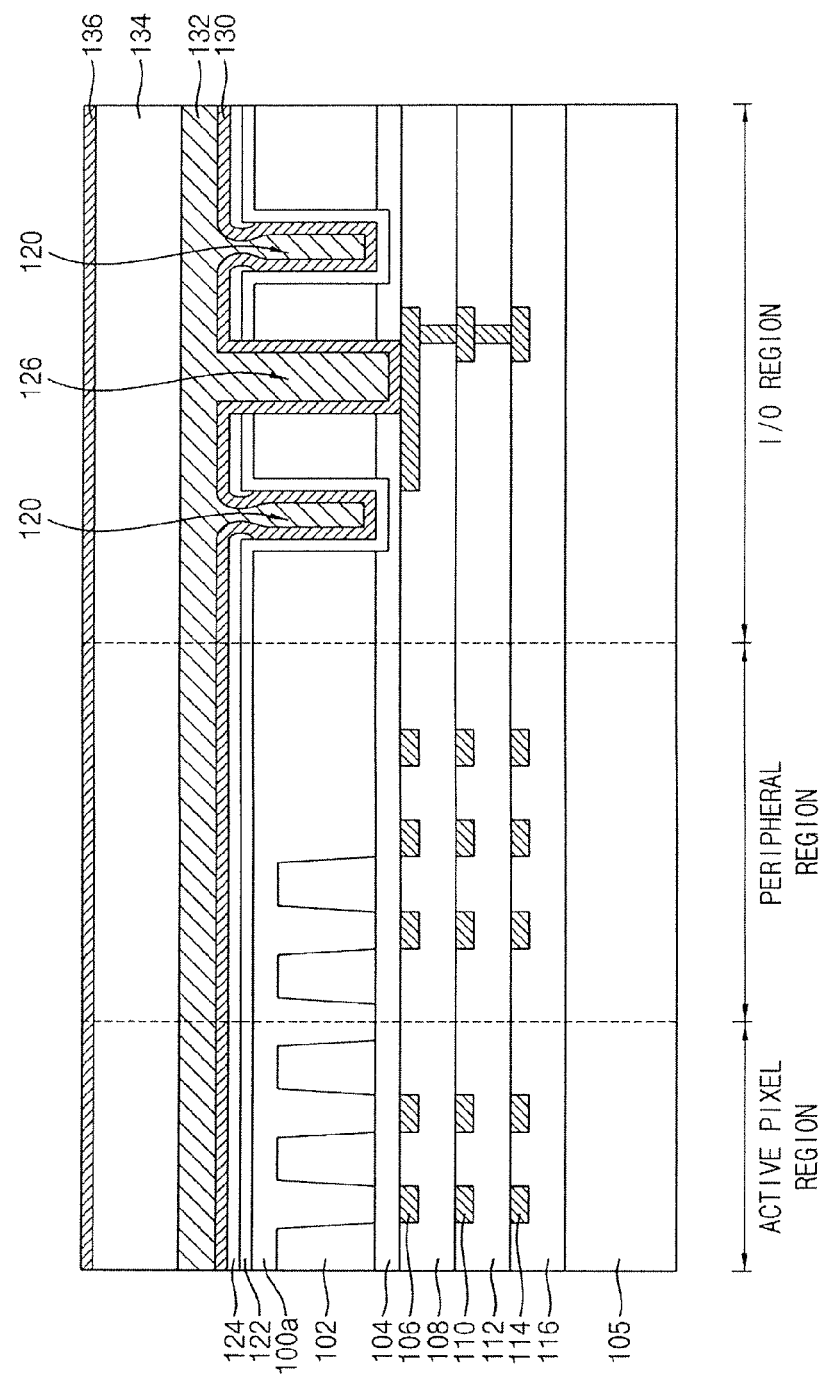

Referring to FIG. 11, a second barrier layer 136 may be formed on the second metal layer 134. The second barrier layer may be formed of, e.g., titanium (Ti), titanium nitride (TiNx), tantalum (Ta), tantalum nitride (TaNx), or the like. The second barrier layer 136 may include one layer or at least two layers sequentially stacked.

The first barrier layer 130, the first metal layer 132, the second metal layer 134 and the second barrier layer 136 may be sequentially stacked on the second insulation layer 124 in the active pixel region and the peripheral region. The first barrier layer 130, the first metal layer 132, the second metal layer 134 and the second barrier layer 136 may cover the active pixel region and the peripheral region.

Figure 12:
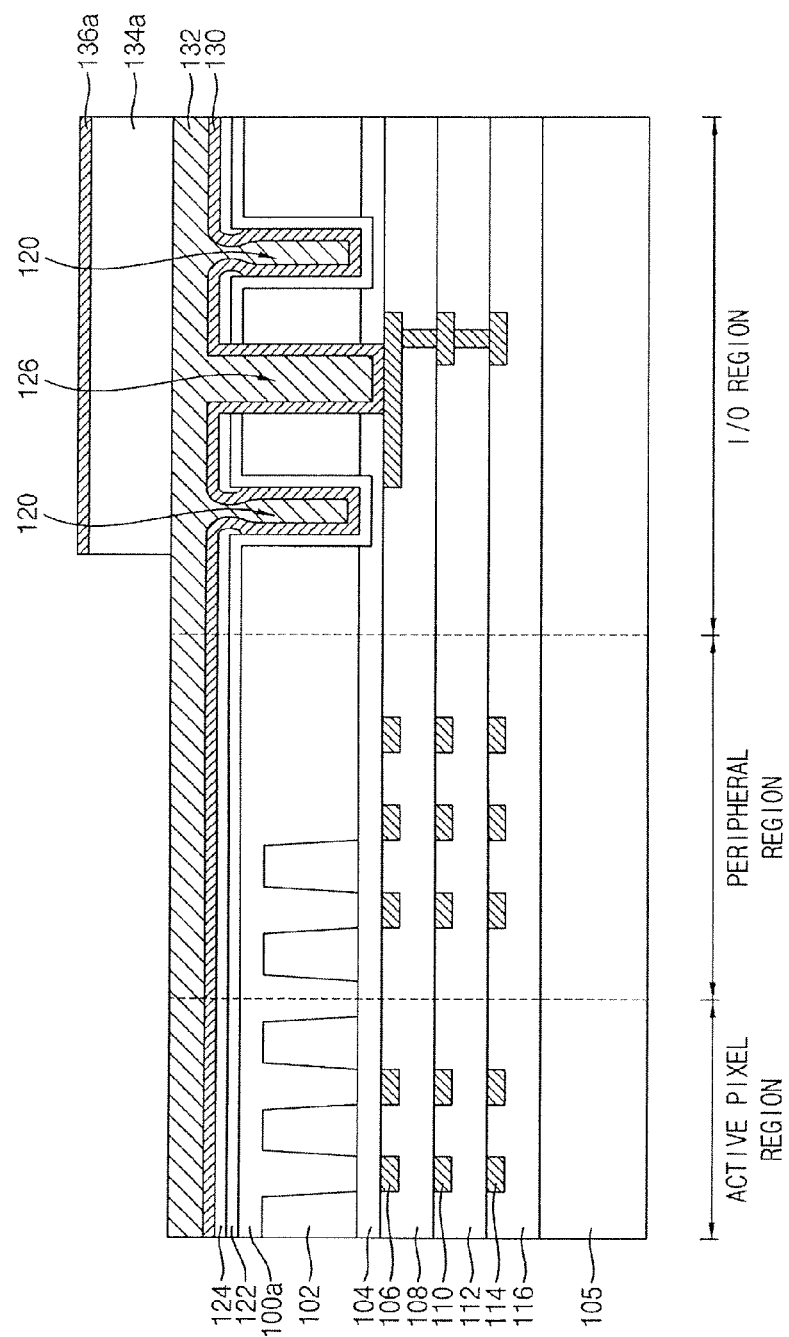
Figure 13:
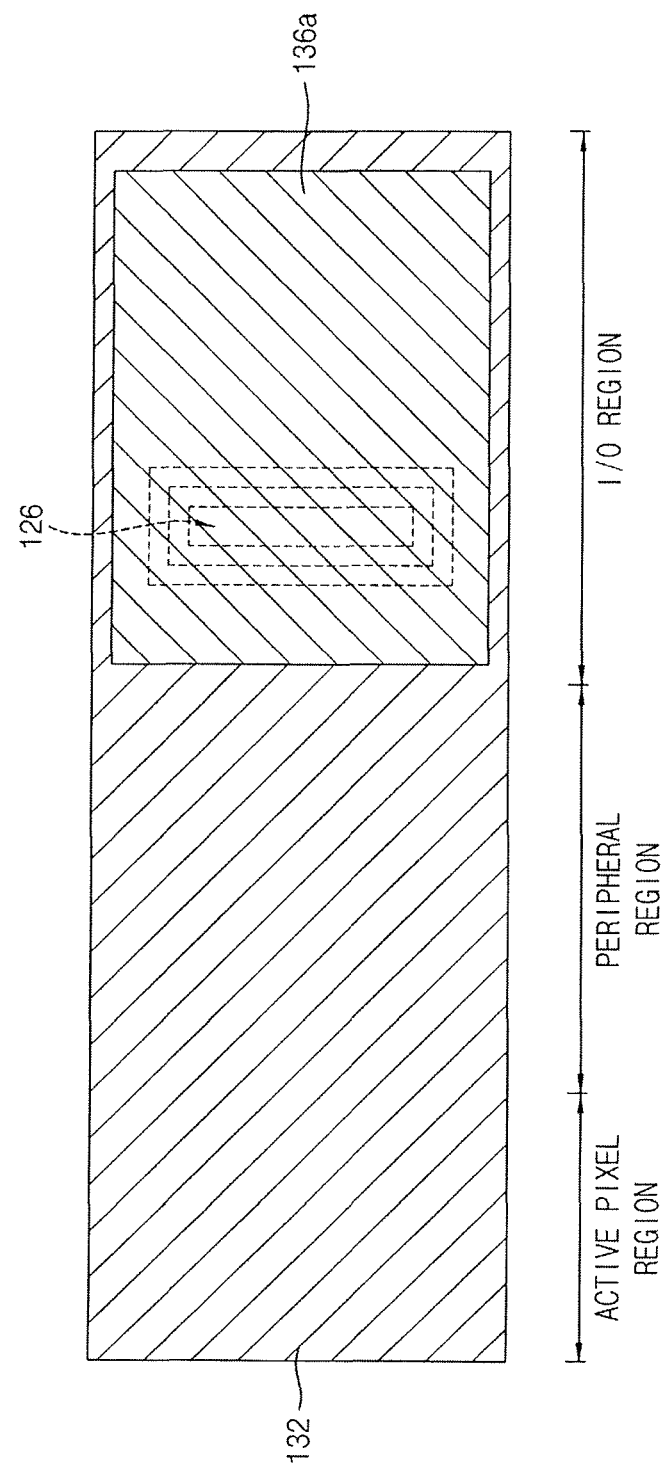

Referring to FIGS. 12 and 13, a third mask may be formed on the second barrier layer 136. The third mask may be a patterned photoresist formed by a photolithography process. The second barrier layer 136 and the second metal layer 134 may be etched using the third mask as an etching mask to form a second barrier pattern 136a and a second pad pattern 134a, respectively, in the I/O region.

During the etching process, the first metal layer 132 may not be etched. Thus, a surface of the first metal layer 132 on which no second pad pattern is formed may be exposed. That is, the surface of the first metal layer 132 may be exposed in the active pixel region, the peripheral region and a portion of the I/O region.

In an example embodiment of the present inventive concept, when the middle barrier layer is formed between the first and second metal layers 132 and 134, the middle barrier layer under the second metal layer 134 may be also etched in the active pixel region, the peripheral region and a portion of the I/O region, during the etching process.

In an example embodiment of the present inventive concept, the second pad pattern 134a may overlap the via hole 126, and may have an area greater than an area of the via hole 126. The second pad pattern 134a may be electrically connected with the via contact which fills the via hole 126. That is, the second pad pattern 134a may be electrically connected with the via contact and the first wiring structure 106.

Figure 14:
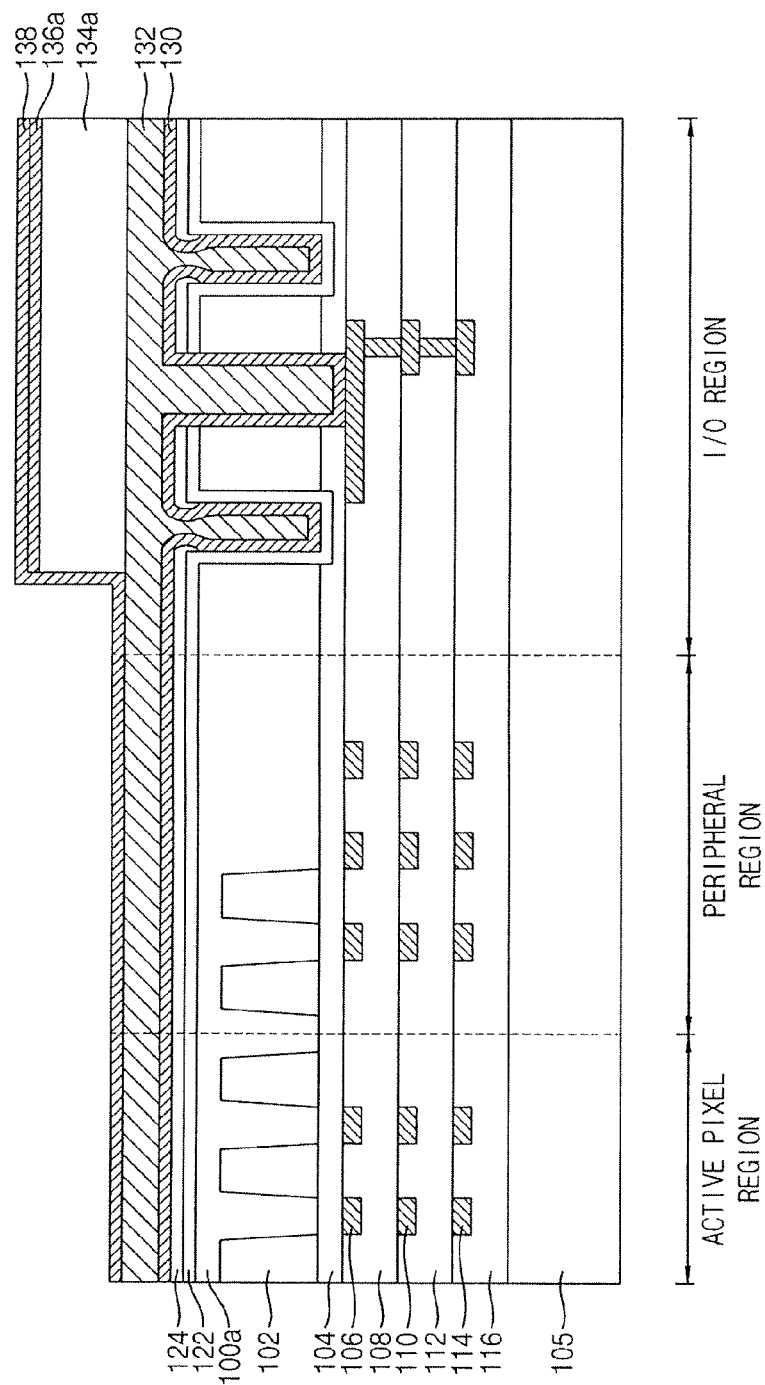
Figure 15:
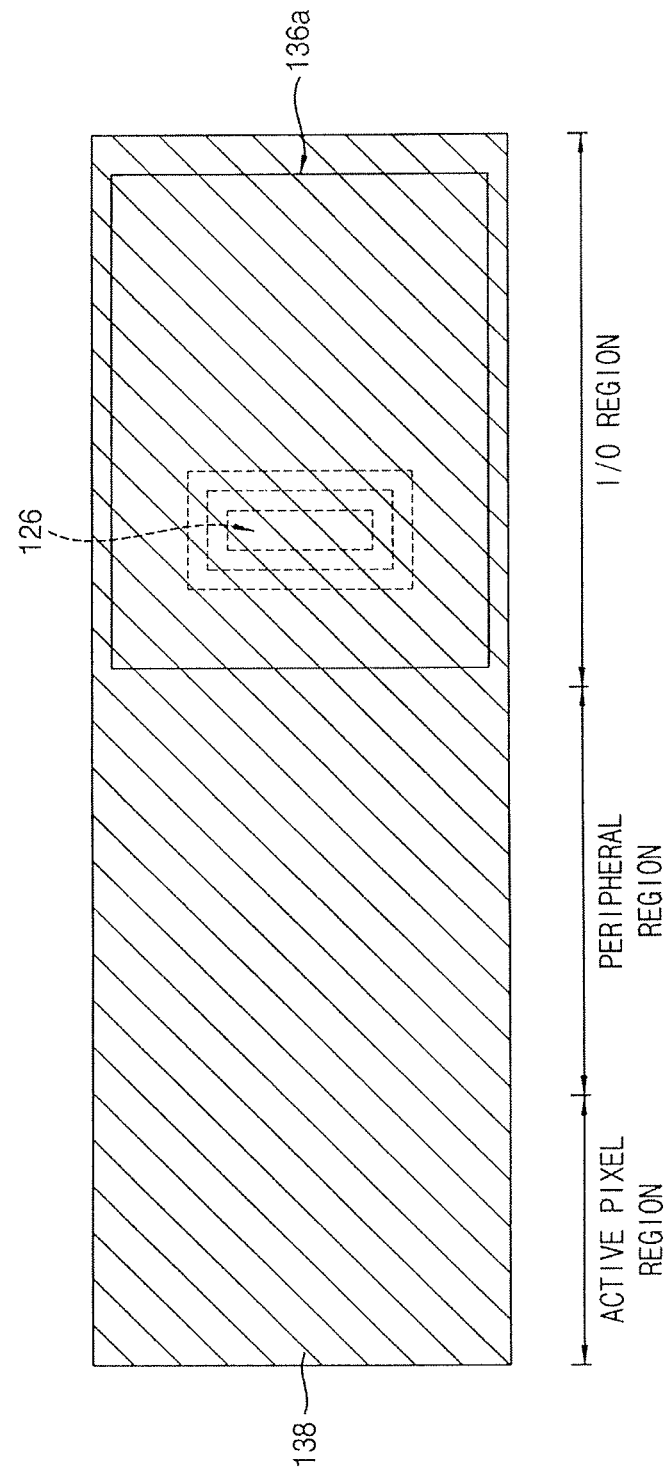

Referring to FIGS. 14 and 15, an anti-reflective layer 138 may be conformally formed on the first metal layer 132, a sidewall of the second pad pattern 134a and the second barrier pattern 136a.

The anti-reflective layer 138 may reduce or prevent light incident into the peripheral region from being reflected from the first metal layer 132, and thus the reflected light may not be incident into the active pixel region. That is, the present inventive concept is to form an antireflection film on the surface of an image sensor to minimize irregularly reflected light being incident into the active pixel region. Thus, the anti-reflective layer 138 may cover the first metal layer 132 in the peripheral region and the active pixel region.

The anti-reflective layer 138 may be formed of, e.g., titanium (Ti), titanium nitride (TiNx), tantalum (Ta), tantalum nitride (TaNx), or the like. The anti-reflective layer 138 may include one layer or at least two layers sequentially stacked. The anti-reflective layer 138 may be formed by, e.g., an ALD process or a CVD process.

The second barrier pattern 136a and the anti-reflective layer 138 may be formed on the second pad pattern 134a in the I/O region. The anti-reflective layer 138 may be formed on the first metal layer 132 in the peripheral region and the active pixel region. A sum of thicknesses of stacked layers, which include the second barrier pattern 136a and the anti-reflective layer 138, on the second pad pattern 134a in the I/O region may be greater than a thickness of a layer, which includes the anti-reflective layer 138, on the first metal layer 132 in the peripheral region and the active pixel region.

Figure 16:
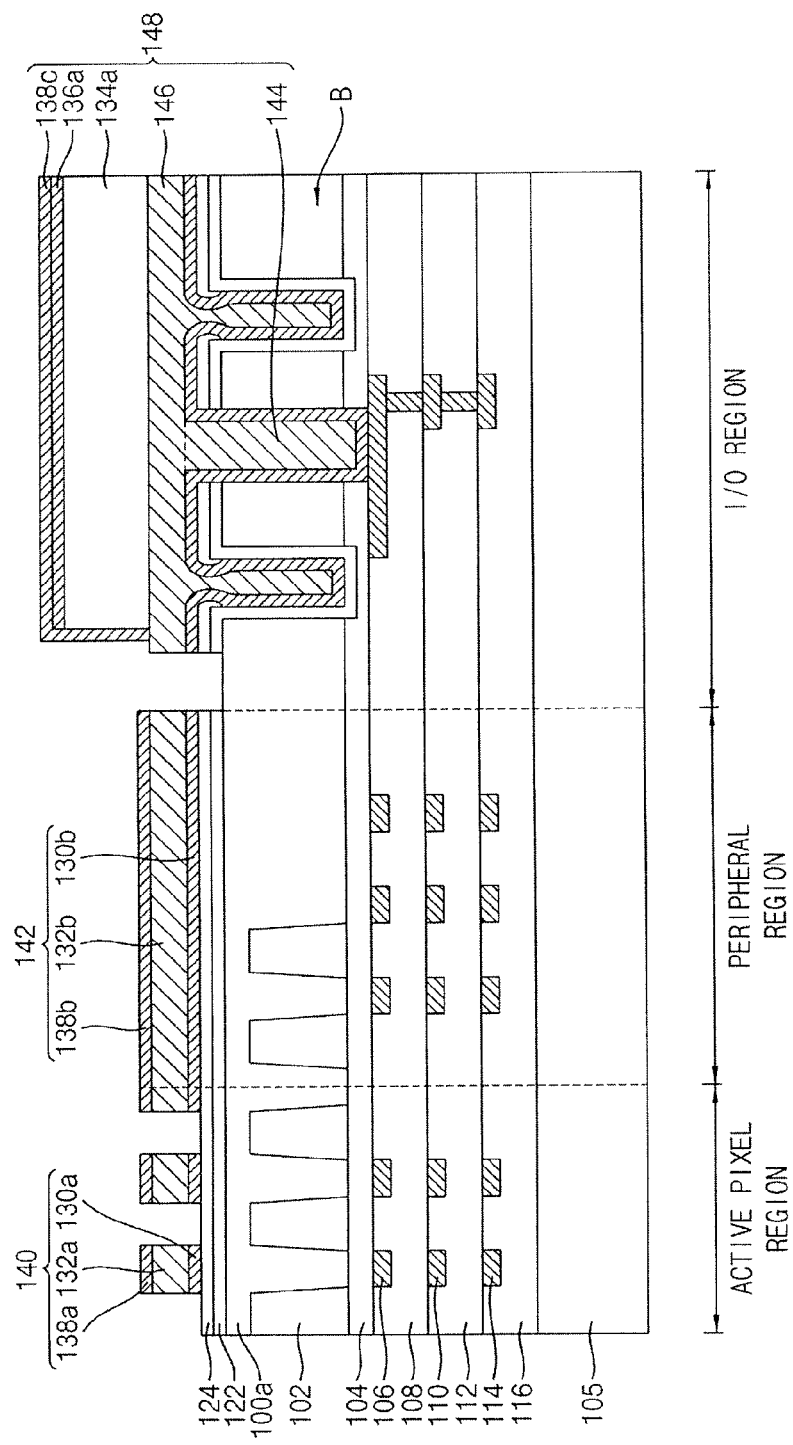
Figure 17:
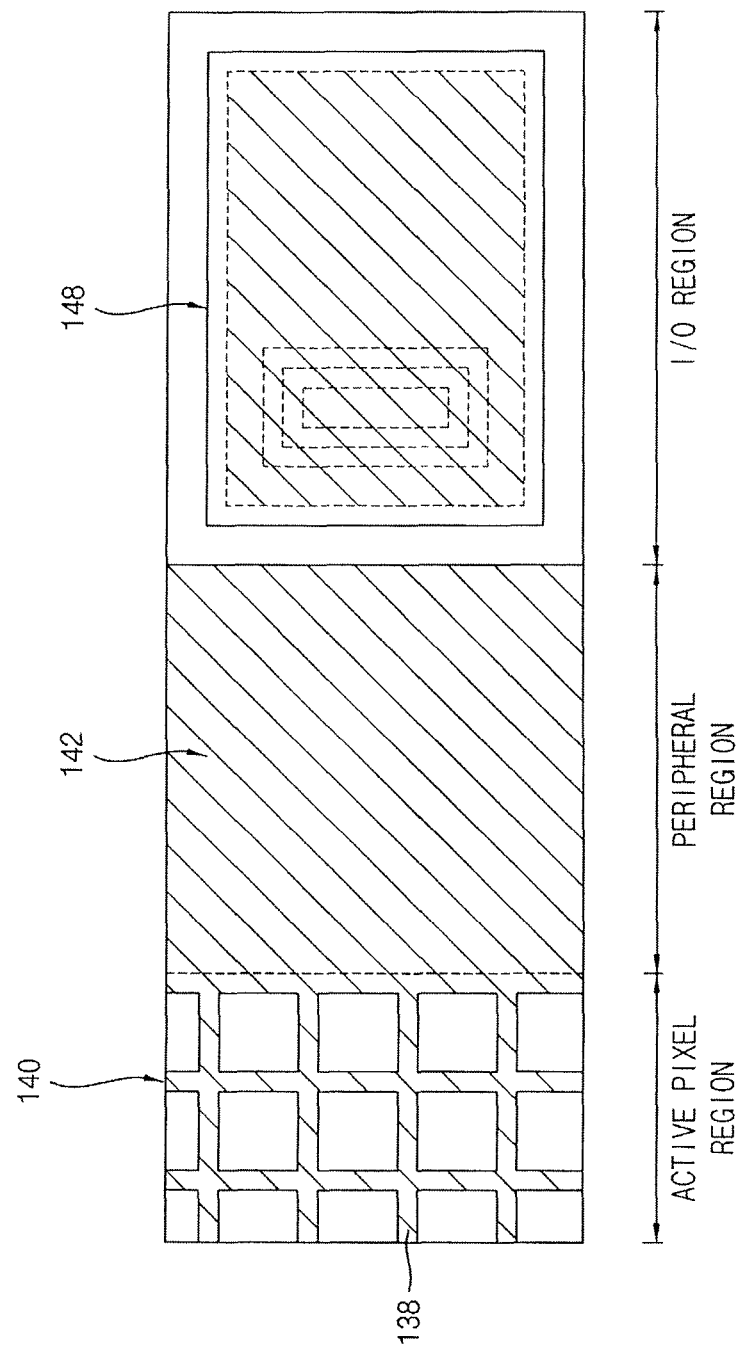

Referring to FIGS. 16 and 17, a fourth mask may be formed on the anti-reflective layer 138. The fourth mask may be a patterned photoresist formed by a photolithography process. The anti-reflective layer 138, the first metal layer 132 and the first barrier layer 130 may be sequentially and anisotropically etched using the fourth mask as an etching mask to form a grid structure 140 in the active pixel region, a light blocking structure 142 in the peripheral region, and a pad structure 148 in the I/O region.

The fourth mask may expose a portion of the anti-reflective layer 138 overlapping the photodiodes 102 in the unit pixels, and thus the unit pixels may be divided by the fourth mask. The fourth mask may have a grid shape.

The fourth mask may cover the peripheral region. Thus, the first barrier layer 130, the first metal layer 132 and the anti-reflective layer 138 in the peripheral region may not be etched, during the etching process.

The fourth mask may cover the second pad pattern 134a in the I/O region. In an example embodiment of the present inventive concept, the fourth mask in the I/O region may have a size substantially the same as or greater than a size of the second pad pattern 134a.

The grid structure 140 may include a first barrier pattern 130a, a first metal pattern 132a and a first anti-reflective pattern 138a sequentially stacked in the active pixel region. An optical crosstalk between the unit pixels may be reduced by the grid structure 140.

The light blocking structure 142 may include a first barrier layer 130b, a first metal layer 132b and a first anti-reflective layer 138b sequentially stacked in the peripheral region. The first metal layer 132b may serve as a light blocking layer. As the light blocking structure 142 includes the anti-reflective layer 138b, a diffused reflection of an incident light into the peripheral region may decrease, and the incidence of the reflected light into the active pixel region may be reduced. Thus, a failure of the image sensor due to the diffused reflection may be minimized. Various combinations of material layers may be used to form the light blocking structure 142. For example, when the first barrier layer 130b is a two-layer structure including a Ti layer on a TiN layer, the first metal layer 132b is a W layer, and the first anti-reflective layer 138b is a TiN layer, the light blocking structure 142 may have a TiN/W/Ti/TiN structure.

The pad structure 148 may include a via contact 144, a first pad pattern 146, a second pad pattern 134a, a second barrier pattern 136a and a second anti-reflective pattern 138c in the I/O region. The pad structure may also include the first barrier layer. Various combinations of material layers may be used to form the pad structure 148. For example, when the first barrier layer is a two-layer structure including a Ti layer on a TiN layer, the first pad pattern 146 includes a W layer, the second pad pattern 134a includes an Al layer, the second barrier pattern 136a includes a TiN layer, and the second anti-reflective pattern 138c includes a TiN layer, the pad structure 148 may have a TiN/TiN/Al/W/Ti/TiN structure.

In an example embodiment of the present inventive concept, the via contact 144 may be formed to fill the via hole 126. The first pad pattern 146 may be formed between the via contact 144 and the second pad pattern 134a. The via contact 144 and the first pad pattern 146 may be merged into one structure. The via contact 144 and the first pad pattern 146 may include materials substantially the same as materials of the first barrier layer 130 and the first metal layer 132.

The via contact 144 may be formed through the semiconductor layer 100a, and may be electrically connected to the first wiring structure 106 on the first surface of the semiconductor layer 100a. The via contact 144 may be electrically isolated from the second portion B of the semiconductor layer 100a by the first and/or second insulation layers 122 and 124 on the inner wall of the isolation trench 120 and on the second surface of the semiconductor layer in the second portion B.

Figure 18:
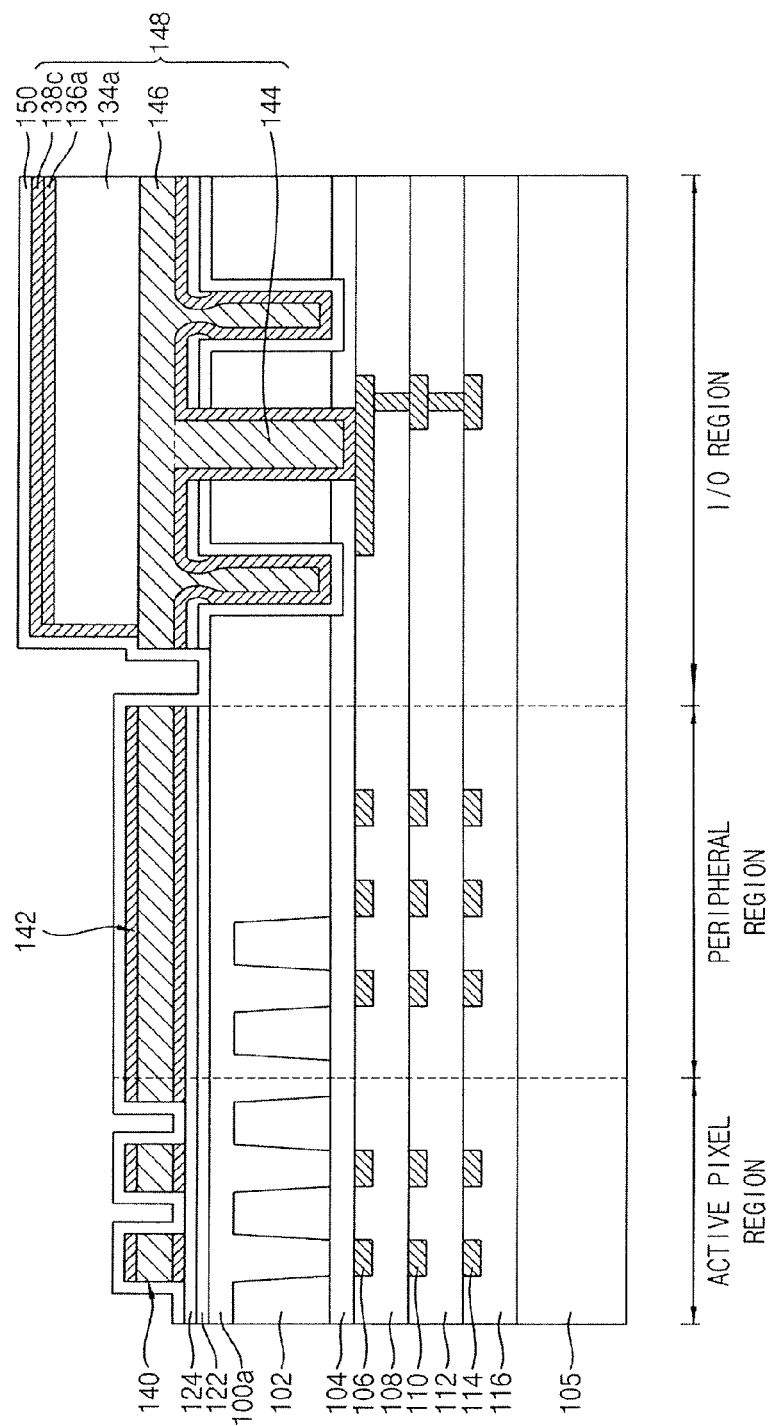

Referring to FIG. 18, a passivation layer 150 may be formed to cover the grid structure 140, the light blocking structure 142, the pad structure 148 and the second insulation layer 124. The passivation layer 150 may be formed of, e.g., silicon nitride.

Figure 19:
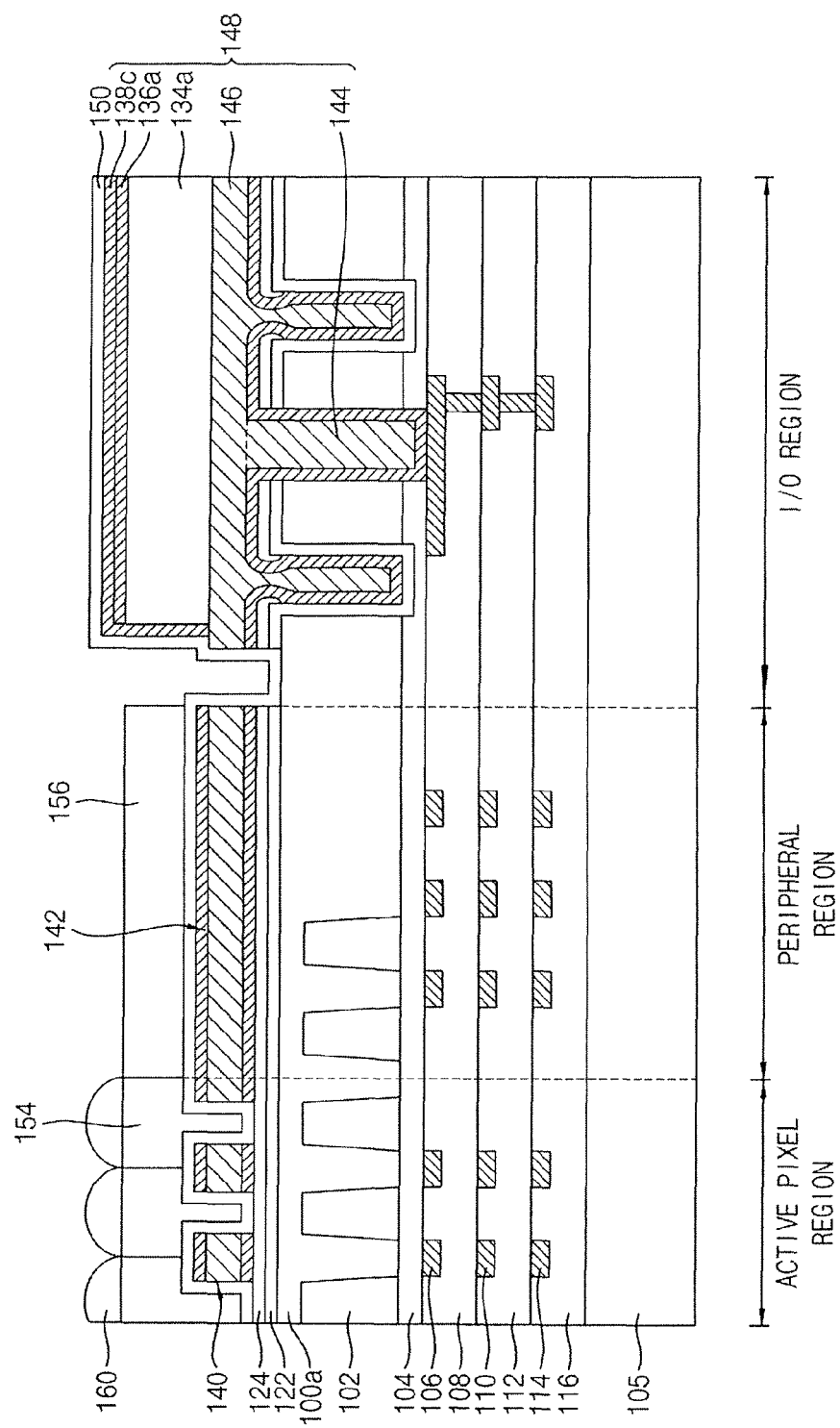

Referring to FIG. 19, a plurality of color filters 154 may be formed on the passivation layer 150 to be aligned with the unit pixels in the active pixel region, respectively. A color filter layer 156 may be formed on the passivation layer 150 in the peripheral region. A plurality of micro lenses 160 may be formed on the color filters 154, respectively.

In an example embodiment of the present inventive concept, the color filters 154 may include a first color filter through which red light may penetrate, a second color filter through which green light may penetrate, and a third color filter through which blue light may penetrate.

The color filters 154 may be formed by coating a photoresist layer including a pigment and patterning the photoresist layer. That is, the first color filter may be formed by coating a first color filter layer and patterning the first color filter layer. The second color filter may be formed by coating a second color filter layer and patterning the second color filter layer. The third color filter may be formed by coating a third color filter layer and patterning the third color filter layer. The first, second and third color filter layers may include a negative photoresist.

The color filter layer 156 in the peripheral region may include at least one of the first, second and third color filter layers.

As shown in FIG. 19, the color filter layer 156 may include one layer. In an example embodiment of the present inventive concept, the color filter layer 156 may be the third color filter layer through which the blue light may penetrate. In this case, when the third color filter layer in the active pixel region is patterned to form the color filter, the third color filter layer in the peripheral region may be also exposed to the radiation during the photoexposure process. Thus, the third color filter layer in the peripheral region may not be removed to form the color filter layer 156. Alternatively, the color filter layer 156 may include the first or second color filter layer.

As the color filter layer 156 is formed on the passivation layer 150 in the peripheral region, only a light of a specific wave length may penetrate into the peripheral region. Thus, the penetrating light into the peripheral region may be reduced. As the first anti-reflective layer 138b is formed under the passivation layer 150 in the peripheral region, a diffused reflection of the penetrating light may be reduced, and thus the incidence of the reflected light to the active pixel region may also be reduced.

In an example embodiment of the present inventive concept, the color filter layer in the peripheral region may include at least two of the first, second and third color filter layers stacked. A stacking order of the first, second and third color filter layers may not be limited thereto, and may be variously changed.

As described above, in the image sensor, an image failure due to the reflected light from the incident light into the peripheral region may be minimized.

Figure 20:
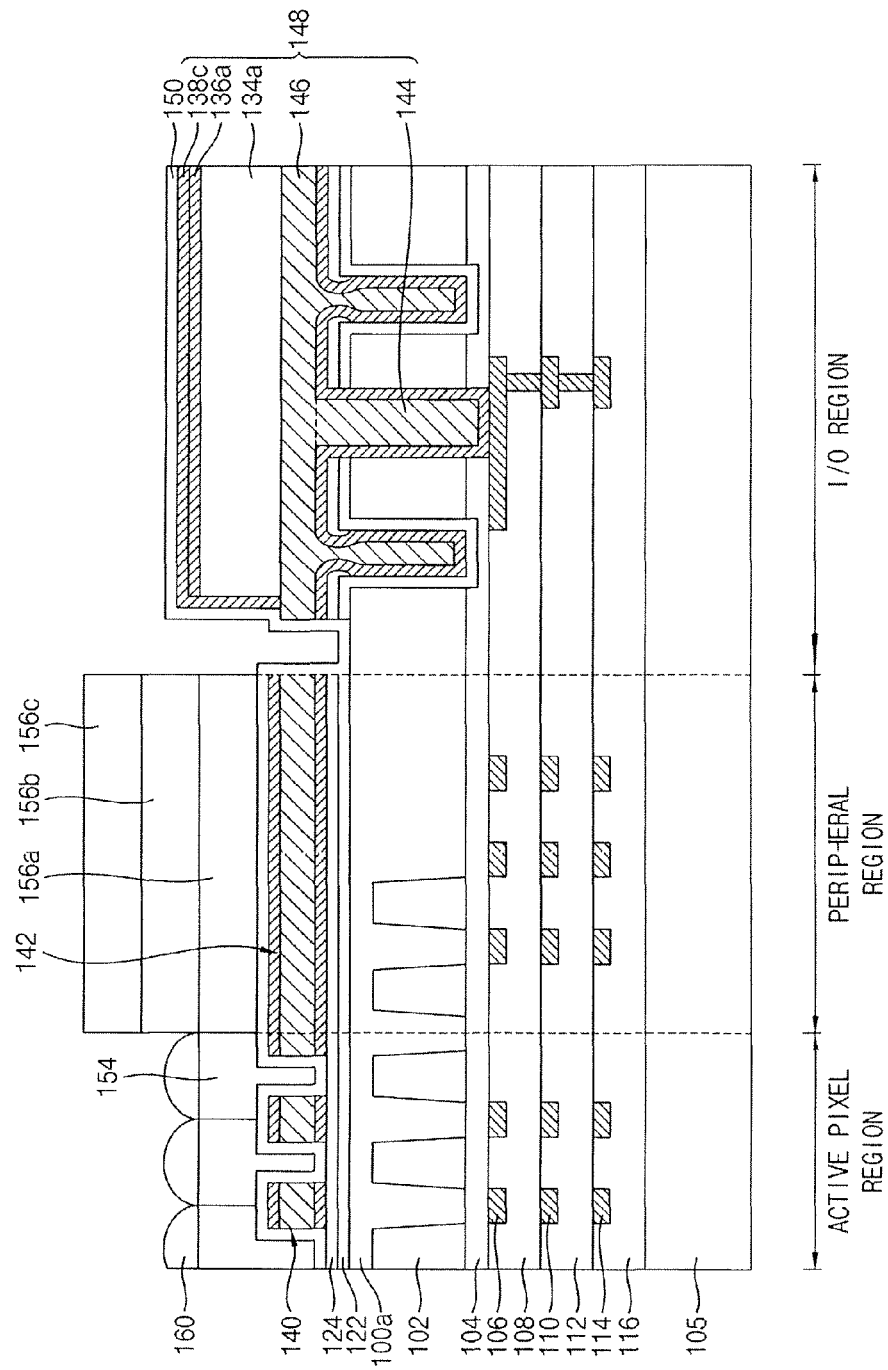
FIG. 20 is a cross-sectional view illustrating a backside illumination image sensor in accordance with an example embodiment of the present inventive concept.

FIG. 20 is a cross-sectional view illustrating a backside illumination image sensor in accordance with an example embodiment of the present inventive concept.

The image sensor may include a plurality of color filter layers stacked in the peripheral region. The image sensor may be manufactured by processes substantially the same as or similar to those illustrated with reference to FIGS. 2 to 18, except for forming the color filter layers.

Referring to FIG. 20, a first color filter layer 156a, a second color filter layer 156b and a third color filter layer 156c may be stacked on the passivation layer 150 in the peripheral region. That is, when the first, second and third color filter layers in the active pixel region are patterned to form the first, second and third color filters, respectively, the first, second and third color filter layers in the peripheral region may be also exposed to the radiation during the photoexposure process. Thus, the first, second and third color filter layers 156a, 156b and 156c in the peripheral region may not be removed.

The red light, the green light and the blue light may penetrate through the first, second and third color filter layers 156a, 156b and 156c, respectively, and each color light may not penetrate through the other two color filter layers corresponding to the other two color lights. For example, the red light may not penetrate through the second and third color filter layers 156b and 156c. Thus, when the first, second and third color filter layers 156a, 156b and 156c are formed on the passivation layer 150 in the peripheral region, visible light may not penetrate through the first, second and third color filter layers 156a, 156b and 156c. Light except the visible light, e.g., infrared ray, may penetrate into the peripheral region, so that the penetrating light may be reduced. Thus, in the image sensor, a failure due to the incident light into the peripheral region may be minimized.

FIGS. 21 to 24 are cross-sectional views and plan views illustrating stages of a method of manufacturing a backside illumination image sensor in accordance with an example embodiment of the present inventive concept.

Processes substantially the same as or similar to those illustrated with reference to FIGS. 2 to 10 may be performed first.

Figure 21:
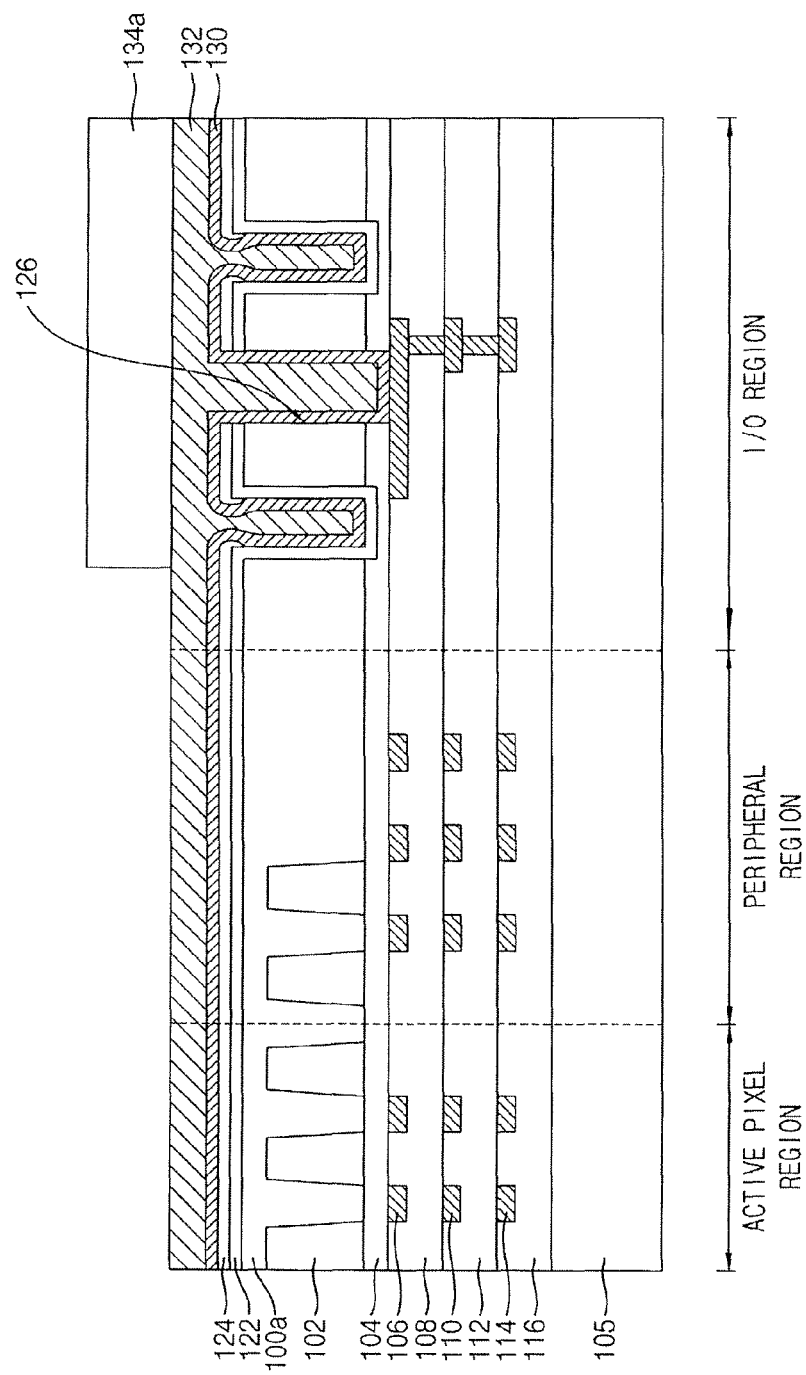
FIGS. 21 to 24 are cross-sectional views and plan views illustrating stages of a method of manufacturing a backside illumination image sensor in accordance with an example embodiment of the present inventive concept.

Referring to FIG. 21, a third mask may be formed on the second metal layer 134. The second metal layer 134 may be etched using the third mask as an etching mask to form a second pad pattern 134a in the I/O region. In an example embodiment of the present inventive concept, the second barrier layer may not be formed on the second metal layer 134.

In an example embodiment of the present inventive concept, the second pad pattern 134a may overlap the via hole 126. The second pad pattern 134a may have an area greater than an area of the via hole 126. The second pad pattern 134a may be electrically connected to a via contact filling the via hole 126. That is, the second pad pattern 134a may be electrically connected with the via contact and the first wiring structure 106.

Figure 22:
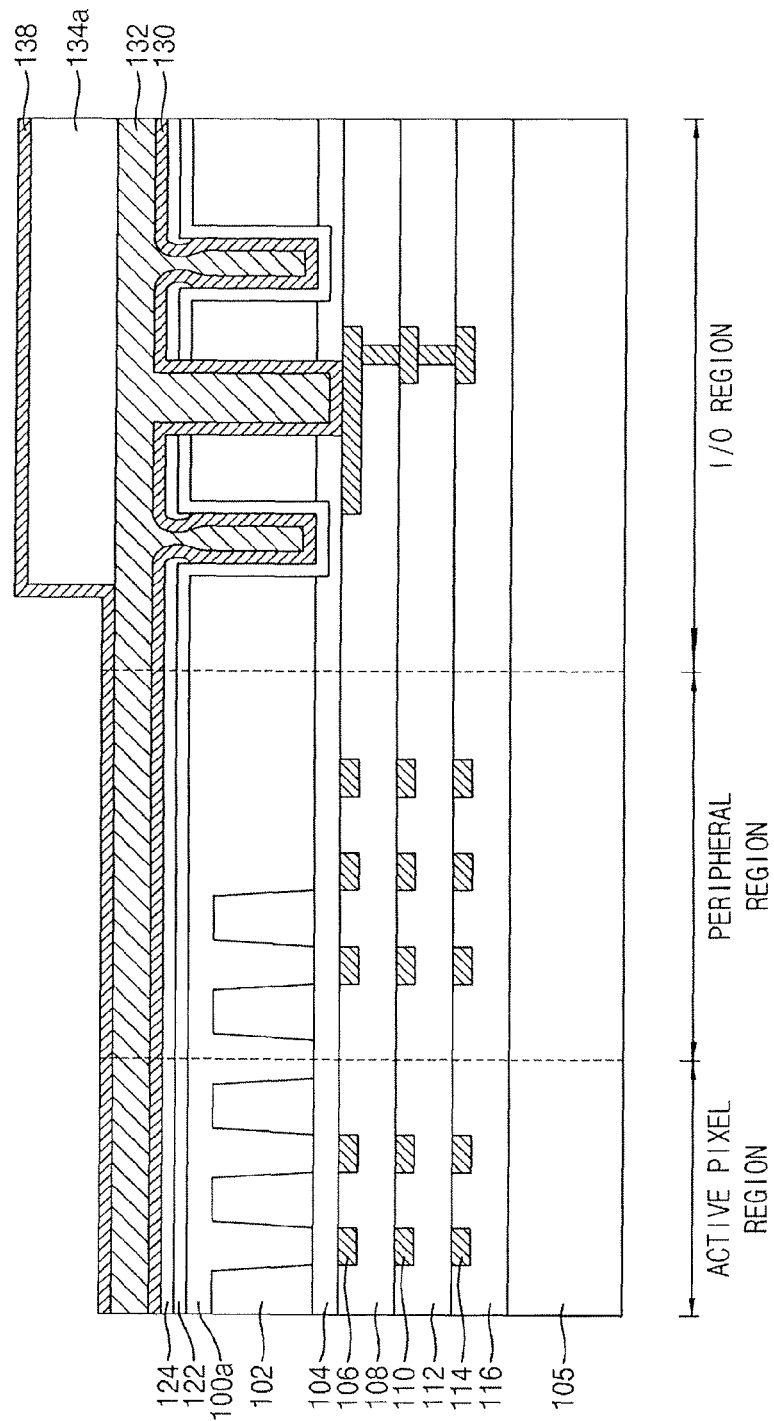

Referring to FIG. 22, an anti-reflective layer 138 may be conformally formed on the first metal layer 132 and the second pad pattern 134a.

The anti-reflective layer 138 may be formed of, e.g., titanium (Ti), titanium nitride (TiNx), tantalum (Ta) or tantalum nitride (TaNx), or the like. The anti-reflective layer 138 may include one layer or at least two layers sequentially stacked.

The anti-reflective layer 138 on the second pad pattern 134a may serve as a barrier layer.

As described above, the anti-reflective layer 138 may be formed on the second pad pattern 134a in the I/O region, and the first metal layer 132 in the peripheral region and the active pixel region. Thus, a thickness of a layer, the anti-reflective layer 138, on the second pad pattern 134a in the I/O region may be substantially the same as a thickness of a layer, the anti-reflective layer 138, on the first metal layer 132 in the peripheral region and the active pixel region.

Figure 23:
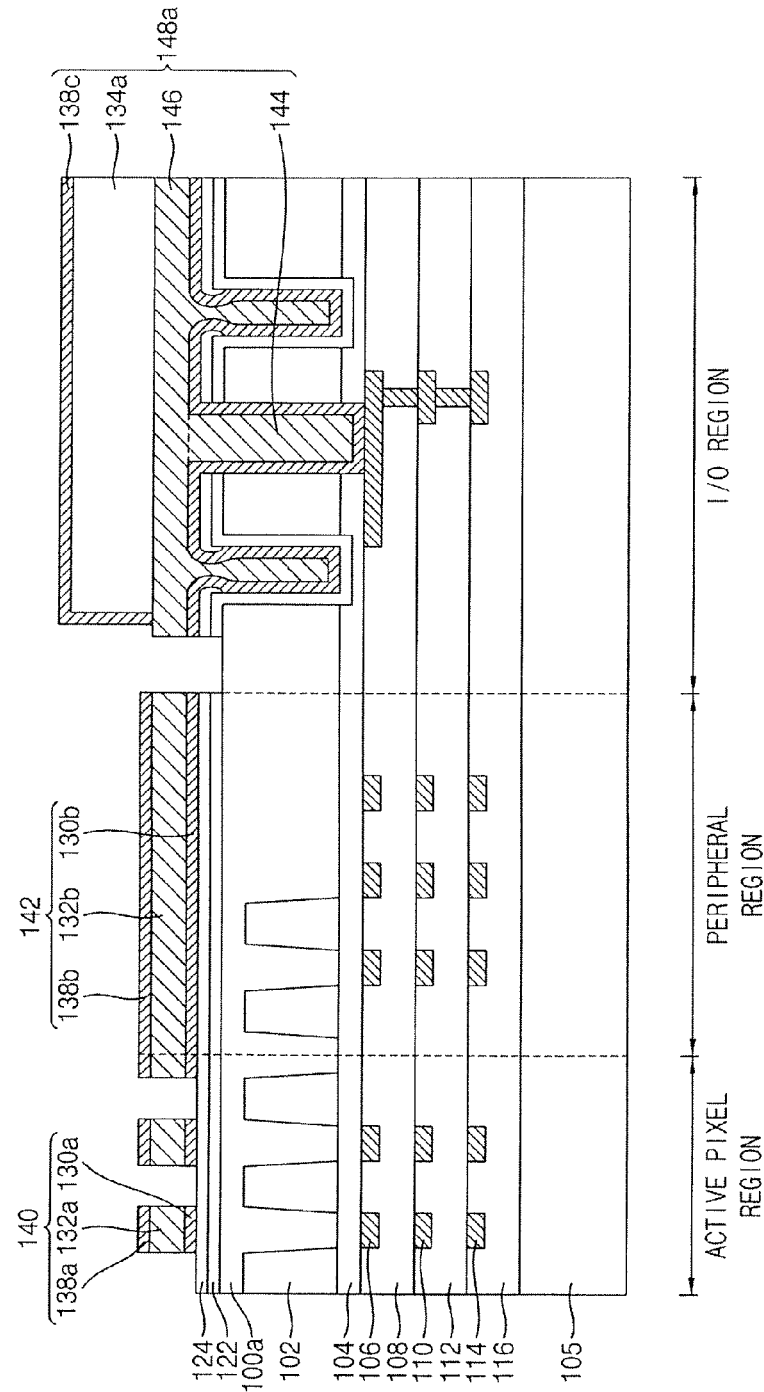

Referring to FIG. 23, a fourth mask may be formed on the anti-reflective layer, and may serve as an etching mask. The anti-reflective layer 138, the first metal layer 132 and the first barrier layer 130 may be sequentially and anisotropically etched to form the grid structure 140 in the active pixel region, the light blocking structure 142 in the peripheral region and a pad structure 148a in the I/O region. The processes performed here may be substantially the same as those illustrated with reference to FIGS. 16 and 17.

The grid structure 140 may include the first barrier pattern 130a, the first metal pattern 132a and the first anti-reflective pattern 138a sequentially stacked.

The light blocking structure 142 may include the first barrier layer 130b, the first metal layer 132b and the first anti-reflective layer 138b sequentially stacked.

The pad structure 148a may include the via contact 144, the first pad pattern 146, the second pad pattern 134a and the second anti-reflective pattern 138c.

Figure 24:
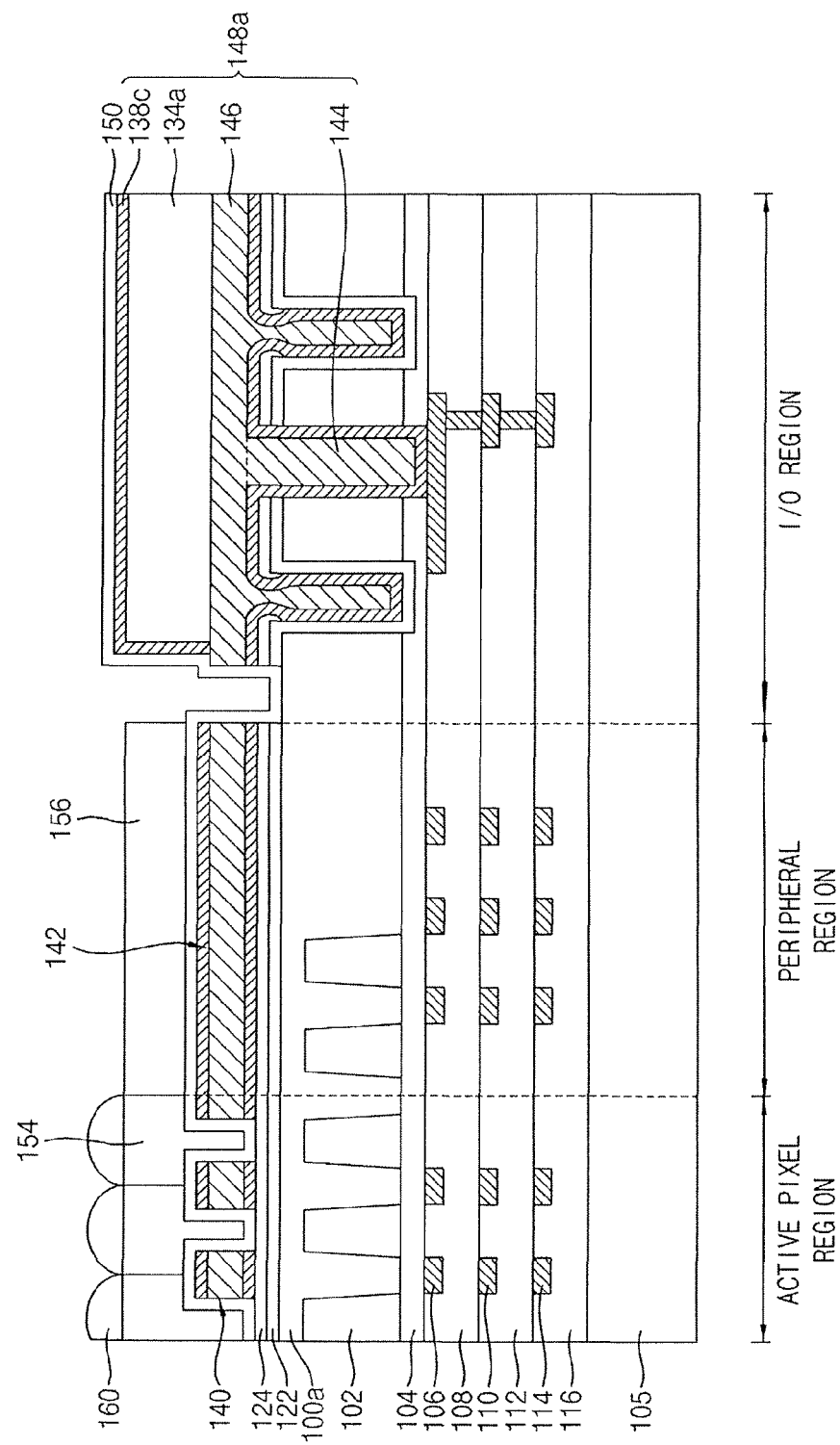

Referring to FIG. 24, processes substantially the same as or similar to those illustrated with reference to FIGS. 18 to 19 may be performed. Thus, the image sensor may be manufactured.

In an example embodiment of the present inventive concept, after forming the grid structure 140, the light blocking structure 142 and the pad structure 148a, processes substantially the same as to those illustrated with reference to FIGS. 18 and 20 may be performed. Thus, the image sensor including a plurality of color filter layers stacked in the peripheral region may be manufactured.

Figure 25:
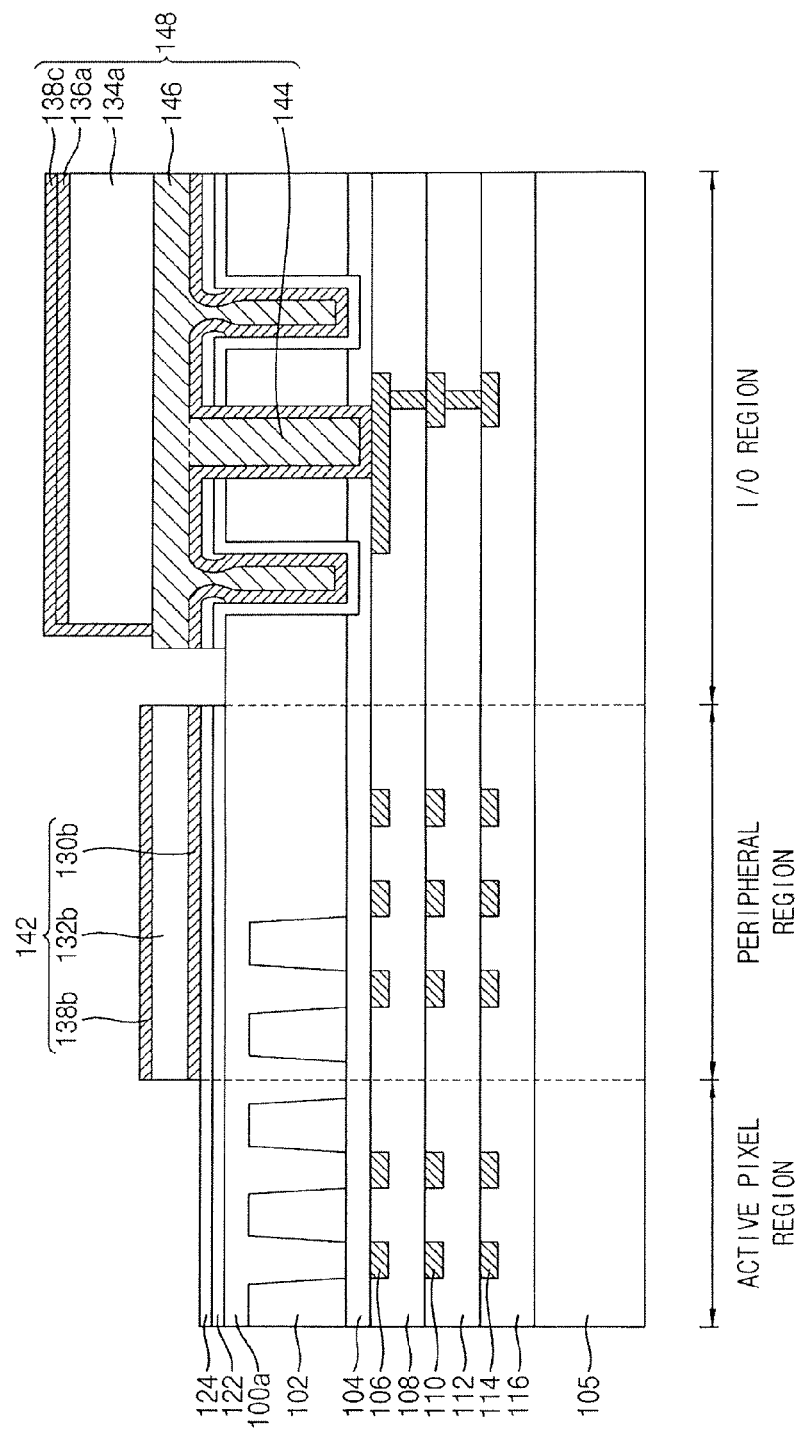
FIGS. 25 and 26 are cross-sectional views and plan views illustrating stages of a method of manufacturing a backside illumination image sensor in accordance with an example embodiment of the present inventive concept.
Figure 26:
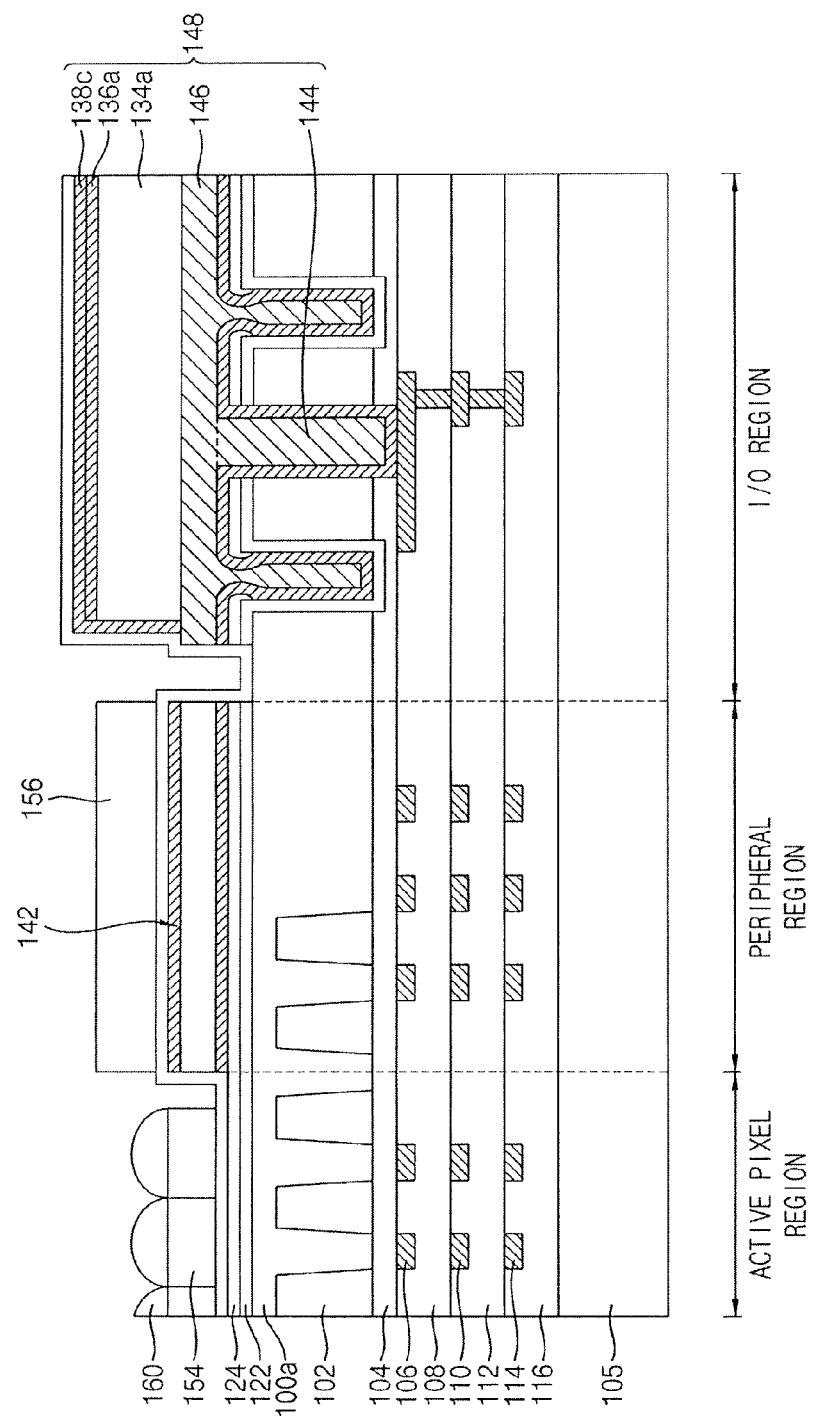

FIGS. 25 and 26 are cross-sectional views and plan views illustrating stages of a method of manufacturing a backside illumination image sensor in accordance with an example embodiment of the present inventive concept.

Processes substantially the same as or similar to those illustrated with reference to FIGS. 2 to 15 may be performed.

Referring to FIG. 25, a fifth mask may be formed on the anti-reflective layer 138. The fifth mask may be a patterned photoresist formed by a photolithography process. The anti-reflective layer 138, the first metal layer 132 and the first barrier layer 130 may be sequentially and anisotropically etched using the fifth mask as an etching mask to form a blocking structure 142 in the peripheral region and a pad structure 148 in the I/O region.

The fifth mask may expose the anti-reflective layer 138 in the active pixel region. Thus, the first barrier layer 130, the first metal layer 132 and the anti-reflective layer 138 in the active pixel region may be etched away, during the etching process. The second insulation layer 124 may be exposed in the active pixel region.

The fifth mask may cover the anti-reflective layer 138 in the peripheral region. Thus, the first barrier layer 130b, the first metal layer 132b and the anti-reflective layer 138b in the peripheral region may not be etched, during the etching process.

The fifth mask may cover the second pad pattern 134a in the I/O region.

The light blocking structure 142 may include the first barrier layer 130b, the first metal layer 132b and the first anti-reflective layer 138b sequentially stacked. The pad structure 148 may include the via contact 144, the first pad pattern 146, the second pad pattern 134a, the second barrier pattern 136a and the second anti-reflective pattern 138c.

Referring to FIG. 26, processes substantially the same as or similar to those illustrated with reference to FIGS. 18 and 19 may be performed. Thus, the image sensor may be manufactured.

In an example embodiment of the present inventive concept, after forming the light blocking structure 142 and the pad structure 148, processes substantially the same as or similar to those illustrated with reference to FIGS. 18 and 20 may be performed. Thus, the image sensor including a plurality of color filter layers stacked on the passivation layer in the peripheral region may be manufactured.

As described above, the backside illumination image sensor may include the light blocking structure including the metal layer and the anti-reflective layer sequentially stacked in the peripheral region. The metal layer may serve as a light blocking layer. A diffused reflection of an incident light into the peripheral region may be reduced by the anti-reflective layer, and the incidence of the reflected light to the active pixel region may also be reduced. Thus, a failure due to the reflected light may be minimized.

The backside illumination image sensor may be applied to, e.g., a computer, a digital camera, a three-dimensional camera, a portable phone, a PDA, a scanner, a vehicle navigation device, a video phone, a monitoring system, an automatic focus system, a tracking system, an operation monitoring system, an image stabilizing system, or the like.

Although a few example embodiments have been described in the forgoing, it is to be understood that the present inventive concept is not limited to these specific example embodiments, and that modifications to the disclosed example embodiments, as well as other example embodiments, are intended to be included within the scope of the appended claims.

What is claimed is:

1. A method of manufacturing an image sensor, the method comprising:
    forming a plurality of photodiodes in a semiconductor layer in an active pixel region and a peripheral region;
    forming a structure including a plurality of insulating interlayers and a plurality of wiring structures on a first surface of the semiconductor layer in the active pixel region, the peripheral region and an input/output (I/O) region;
    partially etching the semiconductor layer and a first insulating interlayer of the plurality of insulating interlayers in the I/O region to form a via hole therethrough, the via hole exposing a first wiring structure of the plurality of wiring structures;
    sequentially forming a first metal layer and a second metal layer on a second surface of the semiconductor layer and the via hole, the second surface being opposite the first surface;
    patterning the second metal layer to form a second pad pattern on the semiconductor layer in the I/O region, so that the first metal layer is exposed in the active pixel region and the peripheral region;
    forming an anti-reflective layer on the first metal layer and the second pad pattern; and
    patterning the anti-reflective layer and the first metal layer to form a light blocking structure including the first metal layer and the anti-reflective layer in the peripheral region and a pad structure including a via contact, a first pad pattern, the second pad pattern and a first anti-reflective pattern in the I/O region.

2. The method of claim 1, wherein the anti-reflective layer is formed of titanium, titanium nitride, tantalum or tantalum nitride.

3. The method of claim 1, wherein the second metal layer is formed of a material having an etching selectivity with respect to a material of the first metal layer.

4. The method of claim 1, wherein the first metal layer is formed of tungsten, and the second metal layer is formed of aluminum.

5. The method of claim 1, further comprising, prior to the forming of the via hole:
    partially etching the semiconductor layer to form an isolation trench therethrough to be spaced apart from the via hole, the isolation trench exposing the first insulating interlayer and to surround the via hole; and
    forming an insulation layer on the second surface of the semiconductor layer and an inner wall of the isolation trench.

6. The method of claim 1, further comprising, prior to the forming of the first metal layer, forming a first barrier layer on the second surface of the semiconductor layer and an inner wall of the via hole.

7. The method of claim 1, further comprising, after the forming of the second metal layer, forming a second barrier layer on the second metal layer.

8. The method of claim 1, further comprising:
    forming a grid structure including a first metal pattern and a second anti-reflective pattern stacked between unit pixels in the active pixel region, during the patterning of the anti-reflective layer and the first metal layer.

9. The method of claim 1, further comprising:
    removing the first metal layer and the anti-reflective layer in the active pixel region, during the patterning of the anti-reflective layer and the first metal layer.

10. The method of claim 1, wherein the second pad pattern overlaps the via hole, and the second pad pattern has an area greater than an area of the via hole.

11. The method of claim 1, wherein the first pad pattern in the I/O region is disposed under the second pad pattern, and the first pad pattern in the I/O region has an area substantially the same as or greater than an area of the second pad pattern.

12. A method of manufacturing an image sensor, the method comprising:
    forming a plurality of photodiodes in a semiconductor layer in an active pixel region and a peripheral region;
    forming a structure including a plurality of insulating interlayers and a plurality of wiring structures on a first surface of the semiconductor layer in the active pixel region, the peripheral region and an input/output (I/O) region;

partially etching the semiconductor layer to form an isolation trench therethrough, the isolation trench exposing a first insulating interlayer of the plurality of insulating interlayers;

forming an insulation layer on a second surface of the semiconductor layer and an inner wall of the isolation trench, the second surface being opposite the first surface;

partially etching the semiconductor layer and the first insulating interlayer in the I/O region to form a via hole therethrough, the via hole exposing a first wiring structure of the plurality of wiring structures;

sequentially forming a first metal layer and a second metal layer on the insulation layer and the via hole;

patterning the second metal layer to form a second pad pattern on the semiconductor layer in the I/O region, so that the first metal layer is exposed in the active pixel region and the peripheral region;

forming an anti-reflective layer on the first metal layer and the second pad pattern; and patterning the anti-reflective layer and the first metal layer to form a light blocking structure including the first metal layer and the anti-reflective layer in the peripheral region and a pad structure including a via contact, a first pad pattern, the second pad pattern and a first anti-reflective pattern in the I/O region.

13. The method of claim 12, wherein the anti-reflective layer is formed of titanium, titanium nitride, tantalum or tantalum nitride.

14. The method of claim 12, wherein the first metal layer is formed of tungsten, and the second metal layer is formed of aluminum.

15. The method of claim 12, wherein the isolation trench has a ring shape in a plan view, and the via hole is formed at a portion of the semiconductor layer surrounded by the isolation trench.

16. The method of claim 12, further comprising:
forming a grid structure including a first metal pattern and a second anti-reflective pattern stacked between unit pixels in the active pixel region, during the patterning of the anti-reflective layer and the first metal layer.

17. A method of manufacturing an image sensor, the method comprising:

forming a plurality of photodiodes in a semiconductor layer in an active pixel region and a peripheral region;

sequentially forming an insulating interlayer and a wiring structure on a first surface of the semiconductor layer in the active pixel region, the peripheral region and an input/output (I/O) region;

forming a via hole through the semiconductor layer and the insulating interlayer to expose the wiring structure;

sequentially forming a first metal layer and a second metal layer on a second surface of the semiconductor layer and the via hole, the second surface being opposite the first surface;

patterning the second metal layer to form a second pad pattern in the I/O region, and to expose the first metal layer in the active pixel region and the peripheral region;

forming an anti-reflective layer on the first metal layer and the second pad pattern; and patterning the anti-reflective layer and the first metal layer to form a light blocking structure including the first metal layer and the anti-reflective layer in the peripheral region, a pad structure including a via contact, a first pad pattern, the second pad pattern and a first anti-reflective pattern in the I/O region, and a grid structure including a first metal pattern and a second anti-reflective pattern stacked between unit pixels in the active pixel region.

18. The method of claim 17, wherein the anti-reflective layer is formed of titanium, titanium nitride, tantalum or tantalum nitride.

19. The method of claim 17, wherein the first metal layer is formed of tungsten, and the second metal layer is formed of aluminum.

20. The method of claim 17, further comprising, prior to the forming of the via hole:
forming an isolation trench through the semiconductor layer to be spaced apart from the via hole, the isolation trench exposing the insulating interlayer and to surround the via hole; and
forming an insulation layer on the second surface of the semiconductor layer and an inner wall of the isolation trench.

* * * * *